(12) United States Patent
Kojo et al.

(10) Patent No.: US 8,884,712 B2
(45) Date of Patent: Nov. 11, 2014

(54) OSCILLATOR

(75) Inventors: Takuya Kojo, Kakogawa (JP); Kenji Moriguchi, Kakogawa (JP); Ryuji Matsuo, Kakogawa (JP); Tetsuya Hanaki, Kakogawa (JP)

(73) Assignee: Daishinku Corporation, Kakogawa-shi (JP)

( * ) Notice: Subject to any disclaimer, the term of this patent is extended or adjusted under 35 U.S.C. 154(b) by 116 days.

(21) Appl. No.: 13/520,814

(22) PCT Filed: Jun. 10, 2011

(86) PCT No.: PCT/JP2011/063369
§ 371 (c)(1),
(2), (4) Date: Jul. 6, 2012

(87) PCT Pub. No.: WO2011/155600
PCT Pub. Date: Dec. 15, 2011

(65) Prior Publication Data
US 2012/0280759 A1    Nov. 8, 2012

(30) Foreign Application Priority Data

Jun. 11, 2010 (JP) ................................. 2010-134302

(51) Int. Cl.
*H03B 5/30* (2006.01)
*H03H 9/05* (2006.01)
*H03H 9/10* (2006.01)
*H01L 23/055* (2006.01)

(52) U.S. Cl.
CPC .... *H03H 9/1021* (2013.01); *H01L 2224/16225* (2013.01); *H03H 9/0542* (2013.01); *H01L 23/055* (2013.01)
USPC .......................... 331/155; 331/107 R; 331/154

(58) Field of Classification Search
USPC ............. 331/68, 107 R, 116 R, 154, 155, 158
See application file for complete search history.

(56) References Cited

U.S. PATENT DOCUMENTS

| 6,081,164 A * | 6/2000 | Shigemori et al. ............. 331/16 |
| 2005/0184625 A1* | 8/2005 | Miyazaki ...................... 310/348 |
| 2009/0236936 A1* | 9/2009 | Tamura ......................... 310/314 |

FOREIGN PATENT DOCUMENTS

| JP | 11-251839 A | 9/1999 |
| JP | 2000-031773 A | 1/2000 |
| JP | 2000-332561 A | 11/2000 |
| JP | 2005-244350 A | 9/2005 |
| JP | 2006-140744 A | 6/2006 |
| JP | 2007-173431 A | 7/2007 |
| JP | 2007-228295 A | 9/2007 |
| JP | 2009-246696 A | 10/2009 |
| JP | 2010-119057 A | 5/2010 |

* cited by examiner

*Primary Examiner* — Joseph Chang
*Assistant Examiner* — Jeffrey Shin
(74) *Attorney, Agent, or Firm* — Marvin A. Motsenbocker; Mots Law, PLLC

(57) ABSTRACT

There are disposed a sealing member, a pair of electrode pads to electrically couple a piezoelectric resonator, a plurality of connection pads to electrically couple an integrated circuit element and the piezoelectric resonator, and wiring patterns to establish electrical continuity between the pair of electrode pads and the plurality of connection pads, and the piezoelectric resonator and the integrated circuit element are disposed side by side in plan view. An output wiring pattern establishes electrical continuity between one of the connection pads and an alternating current output terminal of an oscillation circuit, and a power source wiring pattern establishs electrical continuity between one of the connection pads and a direct current power source terminal of the oscillation circuit. The electrode pads are disposed closer to the power source wiring pattern than the output wiring pattern.

15 Claims, 13 Drawing Sheets

OSCILLATOR

TECHNICAL FIELD

The present invention relates to an oscillator.

BACKGROUND ART

Oscillators hermetically enclose the vibrating region of piezoelectric resonators, which are configured to effect piezoelectrical vibration, examples including a crystal oscillator.

Crystal oscillators each include a package defined by a base of a ceramic material in the form of a box and a single plate lid of a metallic material. In the internal space of the package, a piezoelectric resonator and an IC chip are held by and bonded to the base. The bonding of the base and the lid hermetically encloses the piezoelectric resonator and the IC chip in the internal space of the package (see, for example, Patent Document 1).

A crystal oscillator described in Patent Document 1 uses a base that includes two box bodies of ceramic materials that are layered one on top of one another by integral burning. One of the box bodies of the base internally includes a piezoelectric resonator, while the other box body internally includes an IC chip. The base includes, on its rear surface (other principal surface), external terminals to be electrically coupled to an external circuit board, and inspection terminals to measure and inspect the properties of the crystal resonator. The external terminals and the inspection terminals are formed along the outer periphery of the other principal surface.

RELATED ART DOCUMENTS

Patent Documents

Patent document 1: Japanese Unexamined Utility Model Application Publication No. 2009-246696.

SUMMARY OF INVENTION

Problems to be Solved by the Invention

Incidentally, in present days, reduction in the size of electronic components has been advanced. As to oscillators such as a crystal oscillator, lowered height applications have been advanced.

However, in the case of the base shown in Patent Document 1, two box bodies are layered one on top of one another. It is difficult to accommodate lowered height applications of the crystal oscillator with the base shown in Patent Document 1.

The present invention has been achieved in view of the above circumstances, and it is an object of the present invention to provide an oscillator that accommodates lowered height applications.

Means of Solving the Problems

According to one aspect of the present invention, an oscillator may include a sealing member, a pair of electrode pads configured to electrically couple a piezoelectric resonator that effects piezoelectrical vibration, a plurality of connection pads configured to electrically couple an integrated circuit element constituting an oscillation circuit with the piezoelectric resonator, and wiring patterns configured to establish electrical continuity between the pair of electrode pads and the plurality of connection pads, wherein the piezoelectric resonator and the integrated circuit element are disposed side by side in plan view, and the wiring patterns at least include an output wiring pattern configured to establish electrical continuity between one of the connection pads and an alternating current output terminal of the oscillation circuit, and a power source wiring pattern configured to establish electrical continuity between one of the connection pads and a direct current power source terminal of the oscillation circuit, wherein the electrode pads and the connection pads are disposed on one principal surface of a base material constituting the sealing member, and the wiring patterns are disposed at least on the one principal surface of the base material constituting the sealing member, and wherein on the one principal surface, the electrode pads are disposed closer to the power source wiring pattern than the output wiring pattern.

With the aspect of the present invention, the wiring patterns at least include the output wiring pattern and the power source wiring pattern, and the electrode pads and the connection pads are disposed on the one principal surface of the base material constituting the sealing member, and the wiring patterns are disposed at least on the one principal surface of the base material constituting the sealing member, and wherein on the one principal surface, the electrode pads are disposed closer to the power source wiring pattern than the output wiring pattern, and the piezoelectric resonator and the integrated circuit element are disposed side by side in plan view, thereby making it possible to accommodate lowered height applications of the oscillator. As a result, this accommodates lowered height applications of the oscillator.

Also, with another aspect of the present invention, the influence of unnecessary radiation generated from the output wiring pattern on the piezoelectric resonator can be suppressed by separating the electrode pads electrically coupled to the piezoelectric resonator (specifically, the piezoelectric resonator electrically coupled to the electrode pads) from the output wiring pattern through which an alternating current or a high frequency signal flows. In particular, the intensity (amplitude) of a signal flowing through the output wiring pattern is high, but as shown in the present invention, the influence of unnecessary radiation (radiation noise), which is generated from the output wiring pattern, on the piezoelectric resonator can be suppressed by separating the electrode pads (specifically, the piezoelectric resonator electrically coupled to the electrode pads) from the output wiring pattern.

Incidentally, as for the oscillator, even when a frequency of the signal flowing through the output wiring pattern and a frequency of the signal flowing through the electrode pads coupled with the piezoelectric resonator are equal, the phases are shifted. Further, different signal waveforms cause a potential difference, and the difference leads to failure due to the interaction between the output wiring pattern and the electrode pads. In contrast, according to the present invention, the electrode pads (specifically, the piezoelectric resonator electrically coupled to the electrode pads) are separated from the output wiring pattern, compared with the power source wiring pattern, which can suppress the failure due to the interaction.

Generally, in the fabrication process of the oscillator, sputtering is applied to the pair of driving electrodes disposed on both principal surfaces of the piezoelectric resonator, and frequency adjustment of the piezoelectric resonator is carried out with a weight attached according to a deposition method. When the frequency adjustment of the piezoelectric resonator is carried out, there is a case where a fragment of the driving electrodes scattered from the driving electrodes due to the sputtering and materials used for the weight are attached to the output wiring pattern through which the alternating current or the high frequency signal flows. In this case, the surface resistance of the wiring patterns is reduced, which causes failure such as a shirt circuit on the wiring patterns. In contrast, according to the present invention, the electrode pads are disposed closer to the power source wiring pattern than the output wiring pattern. Accordingly, when the piezoelectric resonator is electrically coupled to the electrode pads, the piezoelectric resonator is disposed on the bottom face of the cavity, apart from the output wiring pattern and close to the power source wiring pattern, which provides resistance to failure.

With another aspect of the present invention, an oscillator may include a sealing member, a pair of electrode pads configured to electrically couple a piezoelectric resonator that effects piezoelectrical vibration, a plurality of connection pads configured to electrically couple an integrated circuit element constituting an oscillation circuit with the piezoelectric resonator, and wiring patterns configured to establish electrical continuity between the pair of electrode pads and the plurality of connection pads, and the wiring patterns at least include an output wiring pattern configured to establish electrical continuity between one of the connection pads and an alternating current output terminal of the oscillation circuit, a power source wiring pattern configured to establish electrical continuity between one of the connection pads and a direct current power source terminal of the oscillation circuit, and a ground wiring pattern configured to establish electrical continuity between one of the connection pads and a ground terminal of the oscillation circuit, wherein the electrode pads and the connection pads are disposed on one principal surface of a base material constituting the sealing member, and the wiring patterns are disposed at least on the one principal surface of the base material constituting the sealing member, and the plurality of connection pads are disposed on the one principal surface of the base material constituting the sealing member, and the ground terminal is disposed on other principal surface of the base material, and the oscillation circuit connected to the connection pads is partly disposed in a corresponding region on a side of the one principal surface corresponding to the ground terminal disposed on the other principal surface.

With the aspect of the present invention, the wiring patterns at least include the output wiring pattern, the power source wiring pattern, and the ground wiring pattern, and the electrode pads and the connection pads are disposed on the one principal surface of a base material constituting the sealing member, and the wiring patterns are disposed at least on the one principal surface of the base material constituting the sealing member, and the plurality of connection pads are disposed on the one principal surface of the base material constituting the sealing member, and the ground terminal is disposed on the other principal surface of the base material, and the integrated circuit element connected to the connection pads is partly disposed in a corresponding region on a side of the one principal surface corresponding to the ground terminal disposed on the other principal surface, so that this can accommodate lowered height applications of the oscillator and stabilize the electrical properties of the oscillator.

That is, according to the present invention, the connection pad conducted to the ground terminal is disposed at the corresponding region on the side of the one principal surface corresponding to the ground terminal disposed on the other principal surface, so that the length of the ground wiring pattern can be shortened. As a result, the influence of ringing of the output waveform of the oscillator, which depends on the length of the ground wiring pattern, can be suppressed.

Also, the configuration is such that the ground terminal and the integrated circuit element coupled to the connection pad are layered one on top of one another via the base material of the sealing member. Accordingly, the radiation noise from the integrated circuit element electrically coupled to the connection pad is suppressed with the ground terminal, which facilitates EMI countermeasures. When the shorter the distance between the ground terminal and the integrated circuit element is, or the thinner the thickness of the sealing member is, the more conspicuous these advantageous effects become, which can accommodate lowered height applications of the oscillator.

With respect to the configuration described above, it may be such that a wall portion is provided in a manner as to enclose the cavity on the one principal surface of the base material constituting the sealing member, and a bottom face of the cavity is formed in an approximately rectangular shape and is of a curved surface, and on condition of (m<n), the plurality of connection pads are disposed in a (m×n) matrix shape (matrix) on the bottom face of the cavity, and an n arrangement direction (column direction) is a long side direction of the cavity.

With respect to the sealing member of the above-described configuration, when the integrated circuit element is mounted on the connection pads, and ultrasonic bonding of FCB method is applied, the integrated circuit element is coupled to the connection pads while being oscillated in the column direction or the row direction. Also, with respect to the curved surface of the cavity, the degree of a curve in the short side direction is larger than that in the long side direction. Accordingly, when the n arrangement direction is the short side direction of the cavity, and the integrated circuit element is mounted on the connection pads according to FCB method, there is the case where the integrated circuit element is not coupled to all the connection pads, which leads to the integrated circuit element to be floated with respect to part of the connection pads.

According to the configuration above, the bottom face of the cavity is formed in an approximately rectangular shape and is of the curved surface, and the connection pads are disposed in a (m×n) matrix shape on the bottom face of the cavity, and the n arrangement direction is the long side direction of the cavity. When the integrated circuit element is mounted on the connection pads according to FCB method, all the connection pads are connected with the integrated circuit element (terminals such as the Au bump disposed on the integrated circuit element). In this case, the float of the integrated circuit element (terminals such as the Au bump disposed on the integrated circuit element) with respect to part of the connection pads can be prevented. Also, when the integrated circuit element is mounted on the connection pads according to FCB method, the destabilization of the bonding of the integrated circuit element with the connection pads can be prevented.

With respect to the configuration described above, it may be such that a protrusion portion is provided on the electrode pads. Specifically, the electrode pads may be formed in a rectangular shape in plan view, and the protrusion portion may be provided along any one of sides on the electrode pads. Also, the electrode pads may be formed in a rectangular shape in plan view, and the protrusion portion may be provided on the electrode pads along the diagonal line. Also, the protrusion portion formed in an L-shape in plan view may be provided on the electrode pads.

Accordingly, when the piezoelectric resonator is coupled to the electrode pads with the conductive bonding material, the conductive bonding material on the protrusion portion gathers in space which is a boundary between the protrusion portion and the electrode pads, which can prevent the conductive bonding material from being forced out from the electrode pads. As a result, the flow of the conductive bonding material on another electrode pad disposed in the vicinity of the electrode pad or on the wiring patterns can be prevented, and the short circuit of electrodes of the oscillator can be prevented.

With respect to the configuration described above, it may be such that a pair of driving electrodes disposed on the piezoelectric resonator is disposed in a non-corresponding state with respect to the alternating current output terminal, the direct current power source terminal, the output wiring pattern, and the power source wiring pattern.

With the aspect of the present invention, the pair of driving electrodes disposed on the piezoelectric resonator is in the non-corresponding state with respect to the alternating current output terminal, the direct current power source terminal, the output wiring pattern, and the power source wiring pattern. As a result, unnecessary capacity formed in the oscillator can be prevented without generating capacitive coupling between the pair of driving electrodes and those terminals and patterns. Also, this prevents the driving electrodes from being affected by harmonics of the alternating current output terminal and the output wiring pattern constituting the oscillation circuit to generate noise.

With respect to the configuration described above, it may be such that the wiring patterns coupled to the connection pads are disposed along a side face of the integrated circuit element.

In this case, the wiring patterns coupled to the connection pads are disposed along the side surface of the integrated circuit element. After the integrated circuit element is mounted on the sealing member, a gap of the integrated circuit element with respect to the connection pads can be easily found through an external appearance inspection (in particular, external appearance inspection by the person) based on the positions of the side face of the integrated circuit element and the wiring patterns so as to improve a yield rate.

With respect to the configuration described above, it may be such that a pair of recognition portions for image recognition is disposed on the one principal surface of the base material as an electrode.

In this case, the recognition portions serve as a mounting basis for mounting the piezoelectric resonator on the sealing member. This ensures precise mounting of the piezoelectric resonator on the sealing member. As a result, this reduces misaligned mounting of the piezoelectric resonator on the sealing member, and facilitates the attempt to improve productivity, such as improving the yield rate.

With respect to the configuration described above, it may be such that a boss portion for the piezoelectric resonator and for image recognition is disposed on the one principal surface of the base material.

In this case, the boss portion serves as a mounting basis for mounting the piezoelectric resonator on the sealing member. This ensures precise mounting of the piezoelectric resonator on the sealing member. As a result, this reduces misaligned mounting of the piezoelectric resonator on the sealing member, and facilitates the attempt to improve productivity, such as improving the yield rate.

With respect to the configuration described above, it may be such that a vibrating region of the piezoelectric resonator is hermetically enclosed with a plurality of sealing members, and a gap between the sealing member and the integrated circuit element is equal to or less than 50 μm, and a gap between the sealing member and the piezoelectric resonator is larger than the gap between the sealing member and the integrated circuit element.

In this case, the gap between the sealing member and the integrated circuit element is equal to or less than 50 μm, and the gap between the sealing member and the piezoelectric resonator is larger than the gap between the sealing member and the integrated circuit element, so that the integrated circuit element can serve as a protective wall to prevent the piezoelectric resonator from contacting the sealing member.

Effects of the Invention

According to the aspect of the present invention, it makes it possible to accommodate lowered height applications of an oscillator.

DESCRIPTION OF EMBODIMENTS

Embodiments of the present invention will be described below by referring to the accompanying drawings. In the following embodiments, the present invention is applied to a crystal resonator as a piezoelectric resonator and applied to a crystal oscillator as a piezoelectric resonator device.

<First Embodiment>

Figure 1:
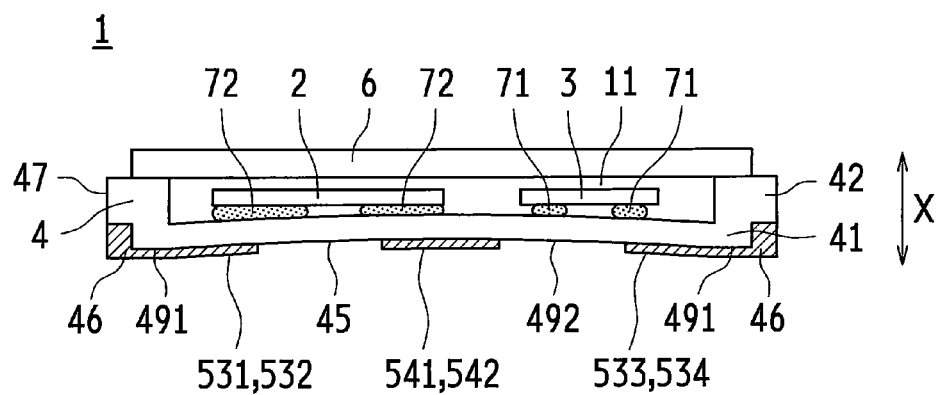
FIG. 1 is a schematic side view of a crystal oscillator according to a first embodiment.
Figure 2:
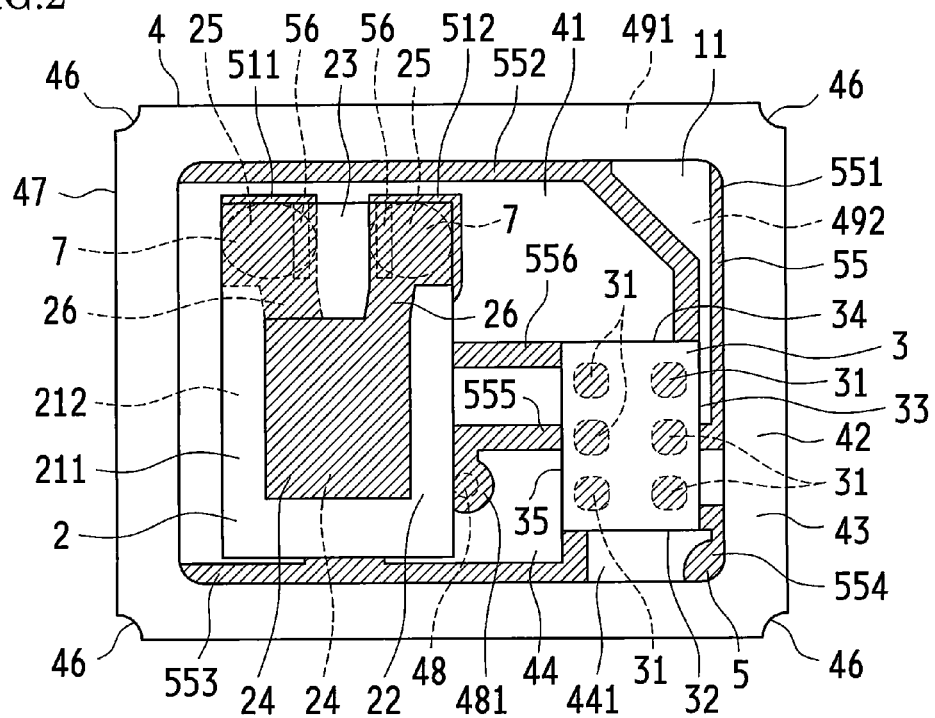
FIG. 2 is a schematic plan view of a base according to the first embodiment with a crystal resonator and an IC chip mounted on the base.

As shown in FIGS. 1 and 2, a crystal oscillator 1 according to this embodiment includes a crystal resonator 2 (piezoelectric resonator) that is configured to effect piezoelectrical vibration, an IC chip 3 (integrated circuit element) that is a single chip integrated circuit element constituting an oscillation circuit with the crystal resonator 2, a base 4 (sealing member) that holds and mounts to hermetically enclose the crystal resonator 2 and the IC chip 3 and a lid 6 (sealing member) opposed to the base 4 to hermetically enclose the crystal resonator 2 and the IC chip 3 held and mounted in the base 4.

The crystal oscillator 1 includes a package defined by the base 4 and the lid 6. The base 4 and the lid 6 are bonded to one another with a bonding material (not shown) to define a hermetically enclosed internal space 11. In the internal space 11, the IC chip 3 is electrically and mechanically bonded to the base 4 with a conductive bump 71 by ultrasonic bonding of Flip Chip Bonding (FCB). The crystal resonator 2 is also electrically and mechanically bonded to the base 4 with a conductive bonding material 72. In this embodiment, the conductive bump 71 uses a metal bump such as a Au bump. The conductive bonding material 72 uses a conductive resin adhesive such as silicone, a metal bump such as a Au bump, or a plating bump. The bonding material uses Ag brazing filler metal, Ni plating, Sn alloy such as a Au/Sn alloy, or glass material.

Next, the constituents of the crystal oscillator 1 will be described below by referring to FIGS. 1 to 4.

The crystal resonator 2 is a substrate made of an AT-Cut crystal piece, and as shown in FIG. 2, has an outer shape in the form of a single plate of rectangular parallelepiped with both principal surfaces 211 and 212 having approximately rectangular shapes.

The crystal resonator 2 includes an oscillating portion 22 that constitutes a vibrating region, and a bonding portion 23 that is bonded to electrode pads 511 and 512 of the base 4, which are external electrodes. The oscillating portion 22 and the bonding portion 23 are integrally formed. The oscillating portion 22 and the bonding portion 23 have the same thickness. While in this embodiment the oscillating portion 22 and the bonding portion 23 have the same thickness, this should not be construed in a limiting sense; the oscillating portion 22 may be thinner so as to adapt to high frequency applications.

The crystal resonator 2 includes a pair of driving electrodes 24 for effecting excitation, a pair of terminal electrodes 25 electrically and mechanically coupled to the electrode pads 511 and 512 of the base 4, and extraction electrodes 26 extending the pair of driving electrodes 24 to the pair of terminal electrodes 25. The extraction electrodes 26 extend the pair of respective driving electrodes 24 to electrically couple them to the pair of respective terminal electrodes 25.

The pair of driving electrodes 24 are disposed to correspond to a center of both principal surfaces 211 and 212 of the oscillating portion 22 in plan view. The pair of driving electrodes 24 are each made of, for example, a Cr—Au film, which includes a Cr layer and a Au layer that are stacked in the order starting on the substrate on the substrate side.

The pair of terminal electrodes 25 are disposed on the other principal surface 212 of the bonding portion 23. The pair of terminal electrodes 25 are disposed adjacent to and covering one side of the substrate in the long side direction. The pair of terminal electrodes 25 are each made of, for example, a Cr—Au film, which includes a Cr layer and a Au layer that are stacked in the order on the substrate side, similarly to the driving electrodes 24.

The pair of extraction electrodes 26 are disposed on the oscillating portion 22 and the bonding portion 23. The pair of extraction electrodes 26 are formed on both principal surfaces 211 and 212 of the crystal resonator 2 without mutual correspondence (opposition) from the oscillating portion 22 over the bonding portion 23. The extraction electrodes 26 are each made of, for example, a Cr—Au film, which includes a Cr layer and an Au layer that are stacked in the order starting on the substrate side, similarly to the driving electrodes 24.

The base 4 is made of a base material of ceramic material such as alumina. As shown in FIGS. 1 to 4, the base 4 is in the form of a box including a bottom portion 41 and a wall portion 42 that extends upward from the bottom portion 41 along an outer periphery of the one principal surface 43 of the base 4. The base 4 includes a plurality of annular plates of ceramic (corresponding to the wall portion 42) and a conductive material of an electrode 5 (see below) on a single plate of ceramic (corresponding to the bottom portion 41). The plurality of annular plates and the electrode 5 are layered one on top of another and integrally burned into a depressed shape (in cross-sectional view).

The base 4 has a top surface on the wall portion 42 as a bonding surface with respect to the lid 6. The bonding surface includes a first bonding layer (not shown) to be bonded to the lid 6. The first bonding layer has a layer structure of a plurality of layers on the top surface of the wall portion 42 of the base 4, including metallized layers (not shown) such as of W and Mo, a Ni film of nickel, and a Au film of gold, which are layered in the order set forth. The metallized layer is integrally burned at the time of the ceramic burning after printing of metallization materials. The Ni film and the Au film are formed by plating technology.

The base 4 has a cavity 44 of rectangular shape in plan view on the one principal surface 43. The cavity 44 is surrounded by the bottom portion 41 and the wall portion 42. The cavity 44 has a bottom face 441 on which the crystal resonator 2 and the IC chip 3 are mounted side by side.

Figure 4:
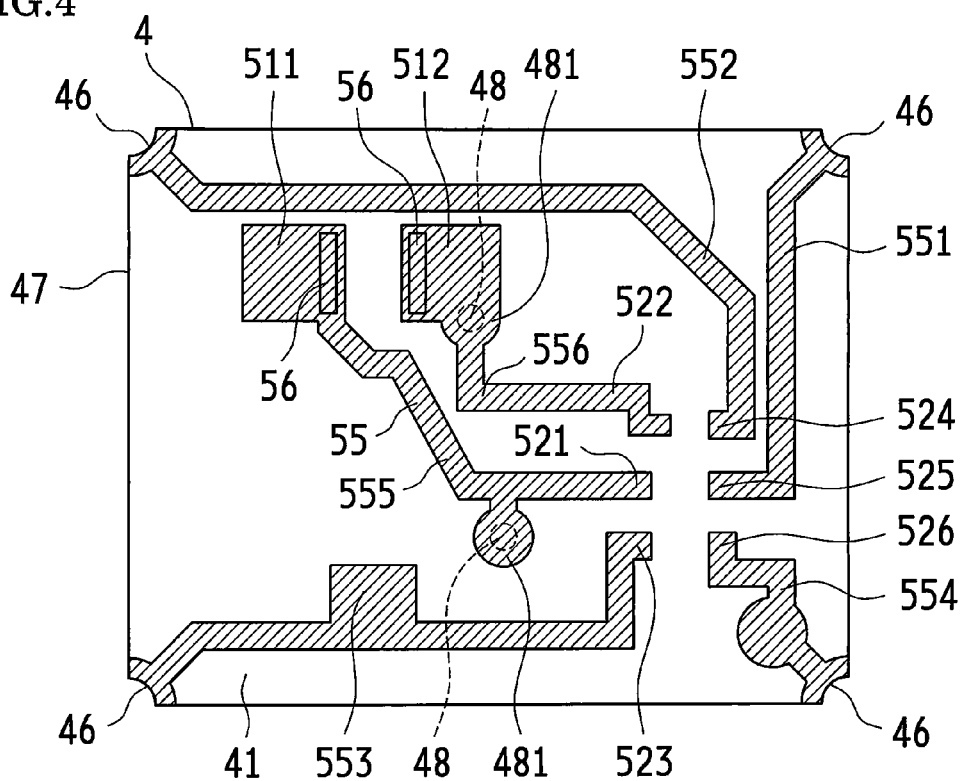
FIG. 4 is a schematic plan view of the base (bottom portion) according to the first embodiment, for illustrating electrode patterns.

As shown in FIG. 4, the base 4 includes castellations 46 on the four corners of the rear surface (the other principal surface 45) of the casing. The castellations 46 are each in the form of an arc-shaped cutout (half-circle depressed portion), and extend in the vertical direction (X direction along the height of the base 4 shown in FIG. 1) on a side surface 47 of the casing.

Figure 3:
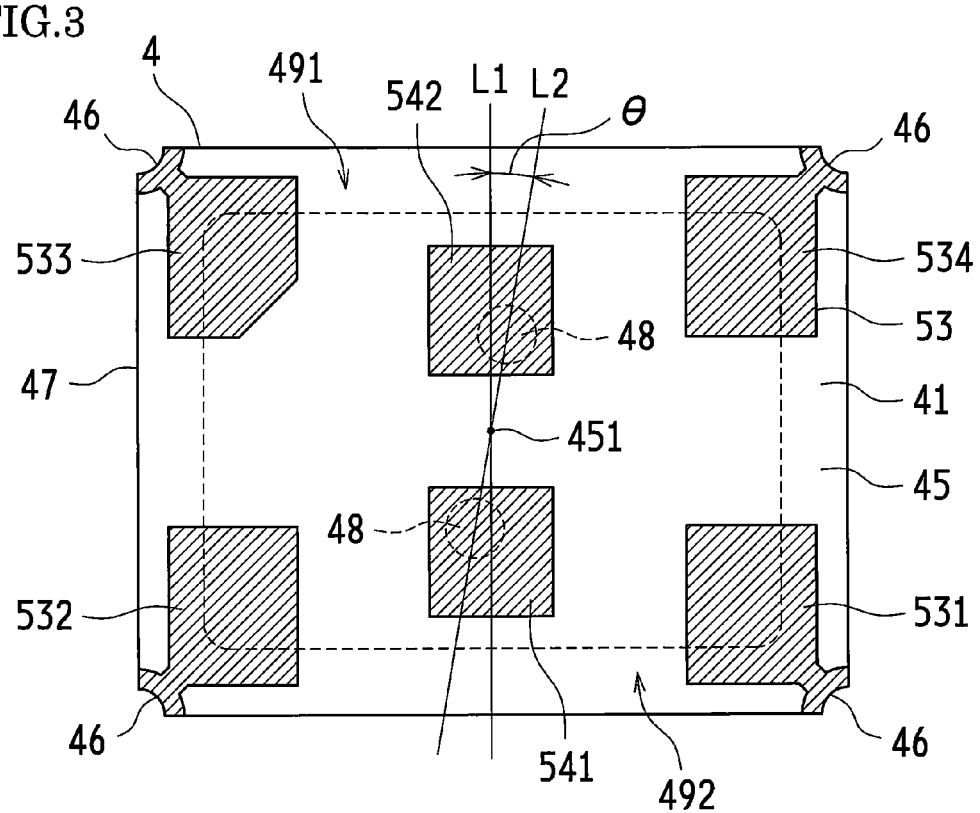
FIG. 3 is a schematic rear view of the base according to the first embodiment.

As shown in FIGS. 2 to 4, the base 4 includes two via holes 48 that extend the driving electrodes 24 of the crystal resonator 2 from the interior of the cavity 44 to outside the cavity 44. The via holes 48 are each filled with a conducting member 481 of Cu, W, Mo, and the like.

The two via holes 48 pass through between both principal surfaces 43 and 45 of the base 4. The via holes 48 are inclined relative to any side of the base 4 and aligned to form an inclination in a direction (see a line L2 in FIG. 4) at angle θ (5 to 30 degrees) relative to the short side direction of the base (see line L1 in FIG. 4). The via holes 48 are mutually symmetrical relative to a center point 451 of the other principal surface 45. The two via holes 48 are disposed in a region other than a corresponding region on the other principal surface 45 that corresponds to the wall portion 42 on the one principal surface 43 (the corresponding region being hereinafter referred to as a wall portion corresponding region 491). That is, the two via holes 48 are disposed in a region on the other principal surface 45 that corresponds to the bottom face 441 of the cavity 44 on the one principal surface 43 (the corresponding region being hereinafter referred to as a cavity corresponding region 492).

As shown in FIGS. 2 to 4, the electrode 5 of the base 4 includes a pair of electrode pads 511 and 512 that are electrically and mechanically coupled to the respective driving electrodes 24 of the crystal resonator 2, connection pads 521, 522, 523, 524, 525, and 526 that are electrically coupled to respective terminals 31 (such as a Au bump) of the IC chip 3, external terminals 53 that are to be electrically coupled to an external device such as an external circuit board (not shown) with a conductive bonding material such as a solder (not shown), and inspection terminals 541 and 542 that measure and inspect the properties of the crystal resonator 2. In the present embodiment, it is noted that the external terminals 53 include an alternating current output terminal 531 of the IC chip 3, a direct current power source terminal 532, a direct current control terminal 533, and a ground terminal 534.

As shown in FIG. 2, the electrode pads 511 and 512 are disposed on the bottom face 441 of the cavity 44 of the one principal surface 43 of the base 4 and disposed closer to a power source wiring pattern 552 (see below) and a control wiring pattern 553 (see below) than an output wiring pattern 551 (see below) and a ground wiring pattern 554 (see below) on the bottom face 441 of the cavity 44. That is, the electrode pads 511 and 512 are disposed separately from the output wiring pattern 551 (see below) and the ground wiring pattern 554 (see below) and disposed closely to the power source wiring pattern 552 (see below) and the control wiring pattern 553 (see below). Also, as shown in FIG. 4, the electrode pads 511 and 512 are each formed in a rectangular shape in plan view (a rectangular shape in the present embodiment), and in the close vicinity of the short side of the electrode pads 511 and 512, there is provided a rectangular protrusion portion 56 along the short side direction.

Also, as shown in FIG. 4, the connection pads 521, 522, 523, 524, 525, and 526 are disposed in a matrix shape (3×2; m×n) on the bottom face 441 of the cavity 44 of the one principal surface 43 of the base 4. It is noted that an n arrangement direction (a column direction that is an n direction) is a long side direction of the cavity 44. Also, as shown in FIG. 4, the connection pads 521, 522, 523, 524, 525, and 526 are disposed on the bottom face 441 of the cavity 44, which is disposed on a common plane of the electrode pads 511 and 512.

Also, as shown in FIG. 3, the alternating current output terminal 531, the direct current power source terminal 532, the direct current control terminal 533, and the ground terminal 534 are disposed in the wall portion corresponding region 491 of the other principal surface 45 (outer periphery of the other principal surface 45), and a part of those terminals are disposed in the cavity corresponding region 492 of the other principal surface 45 (center position with the outer periphery of the other principal surface 45 excluded). Specifically, the alternating current output terminal 531, the direct current power source terminal 532, the direct current control terminal 533, and the ground terminal 534 are disposed on the corners and the castellations 46 of the other principal surface 45. Also, the electrode pad 526 conducted to the ground terminal 534 is disposed in the corresponding region (opposition region) of the one principal surface 43 corresponding (opposite) to the region of the ground terminal 534 disposed on the other principal surface 45, therebetween the base material (base 4) is sandwiched. When the IC chip 3 is disposed on the electrode pad 526 (electrically coupled), a part of the IC chip 3 and the ground terminal 534 are layered opposite to each other therebetween the base material of the base 4 is sandwiched. It is noted that while in the present embodiment the alternating current output terminal 531, the direct current power source terminal 532, the direct current control terminal 533, and the ground terminal 534 are partly disposed in the cavity corresponding region 492, this should not be construed in a limiting sense. All that is necessary is that the alternating current output terminal 531, the direct current power source terminal 532, the direct current control terminal 533, and the ground terminal 534 be disposed in the wall portion corresponding region 491 of the other principal surface 45 (the outer periphery of the other principal surface 45). It is also possible to dispose the alternating current output terminal 531, the direct current power source terminal 532, the direct current control terminal 533, and the ground terminal 534 only in the wall portion corresponding region 491 of the other principal surface 45.

Also, as shown in FIG. 3, the inspection terminals 541 and 542 are disposed only in the cavity corresponding region 492 of the other principal surface 45 (center position with the outer periphery of the other principal surface 45 excluded). Specifically, the inspection terminals 541 and 542 are disposed at a center position of the other principal surface 45 in the long side direction and disposed side by side along the short side direction of the other principal surface 45. Under the inspection terminals 541 and 542, the respective via holes 48 are disposed.

The electrode pads 511 and 512, the connection pads 521 and 522, and the inspection terminals 541 and 542 in the above-described configuration are electrically coupled to each other by way of the via holes 48 and wiring patterns 55 (see the inspection wiring patterns 555 and 556 below). The connection pads 523, 524, 525, and 526 and the alternating current output terminal 531, the direct current power source terminal 532, the direct current control terminal 533, and the ground terminal 534 are electrically coupled to each other via the wiring patterns 55 (see the output wiring pattern 551, the power source wiring pattern 552, the control wiring pattern 553, and the ground wiring pattern 554 below).

As shown in FIG. 4, the wiring patterns 55 include the output wiring pattern 551 to establish electrical continuity between the connection pad 525 and the alternating current output terminal 531 of the IC chip 3, the power source wiring pattern 552 to establish electrical continuity between the connection pad 524 and the direct current power source terminal 532, the control wiring pattern 553 to establish electrical continuity between the connection pad 523 and the direct current control terminal 533, the ground wiring pattern 554 to establish electrical continuity between the connection pad 526 and the ground terminal 534, the inspection wiring pattern 555 to establish electrical continuity between the connection pad 521 and the inspection terminals 542 and the electrode pad 511, and the inspection wiring pattern 556 to establish electrical continuity between the connection pad 522 and the inspection terminal 541 and the electrode pad 512, thereby the electrode pads 511 and 512, and the connection pads 521, 522, 523, 524, 525, and 526 can be conducted. It is noted that the control wiring pattern 553 that couples the connection pad 523 to the direct current control terminal 533 includes a boss portion 58 dedicated to the crystal resonator 2, and the boss portion 58 is continuous along the wiring pattern 55.

Also, while the IC chip 3 is mounted on the base 4, the wiring patterns 55 coupled to the connection pads 522, 523, 524, and 526 are disposed along the side face of the IC chip 3. In the present embodiment, as shown in FIG. 2, the ground wiring pattern 554 coupled to the connection pad 526 is disposed along the lower side surface 32 of the IC chip 3, and the power source wiring pattern 552 coupled to the connection pad 524 is disposed along the right side surface 33 of the IC chip 3, and the inspection wiring pattern 556 coupled to the connection pad 522 is disposed along the upper side surface 34 of the IC chip 3, and the control wiring pattern 553 coupled to the connection pad 523 is disposed along the left side surface 35 of the IC chip 3.

Also, as shown in FIGS. 2 to 4, the pair of driving electrodes 24 disposed on the crystal resonator 2 is disposed via the base material of the base 4 but not opposite to the alternating current output terminal 531, the direct current power source terminal 532, the direct current control terminal 533, the ground terminal 534, the output wiring pattern 551, the power source wiring pattern 552, the control wiring pattern 553, and the ground wiring pattern 554, which is in a "non-corresponding" state.

The electrode 5 of the base 4 is integrally burned with the base 4 after printing of metallization materials such as W and Mo. Among the electrode 5, the electrode pads 511 and 512, the connection pads 521, 522, 523, 524, 525, and 526, the alternating current output terminal 531, the direct current power source terminal 532, the direct current control terminal 533, the ground terminal 534 and the inspection terminals 541 and 542 have nickel platings formed over the respective metallized layers and gold platings formed over the respective nickel platings. It is noted that examples of the method of plating include electrolytic plating and non-electrolytic plating.

As shown in FIG. 1, the lid 6 is made of a metallic material and is in the form of a rectangular parallelepiped single plate. The lid 6 includes, on its bottom face, a bonding material such as a Ag brazing filler metal (not shown) to be bonded to the base 4. A second bonding layer corresponds to a bonding surface of the wall portion 42 of the base 4. The lid 6 is bonded to the base 4 by seam welding, thus forming the package of the crystal oscillator 1 defined by the lid 6 and the base 4.

As shown in FIG. 2, in the crystal oscillator 1 in the above-described configuration, the IC chip 3 is disposed on the bottom face 441 of the cavity 44 of the base 4. The IC chip 3 is electrically and mechanically coupled to the connection pads 521, 522, 523, 524, 525, and 526 via the conductive bumps 71 by ultrasonic bonding of FCB. The crystal resonator 2 is arranged side by side with the IC chip 3 on the bottom face 441 of the cavity 44 of the base 4, and electrically and mechanically coupled to the electrode pads 511 and 512 via the conductive bonding material 72.

Then, the lid 6 is disposed on the base 4 with the IC chip 3 and the crystal resonator 2 mounted on the common plane of the bottom face 441 of the cavity 44. Then, seam sealing is carried out in a nitrogen atmosphere, which includes sweeping a seam roller (not shown) along the short side of the package (the base 4, the lid 6) in plan view, thus melting the first bonding layer and the bonding material. The seam roller (not shown) is then swept along the long side of the package (the base 4, the lid 6) in plan view, thus melting the first bonding layer and the bonding material. The seam sealing implements the bonding between the bonding material on the lid 6 and the first bonding layer on the base 4. Thus, the crystal oscillator 1 with the crystal resonator 2 and the IC chip 3 hermetically enclosed as shown in FIG. 1 is fabricated. The crystal oscillator 1 thus fabricated is mounted on an external circuit board with a conductive bonding material such as a solder. In the crystal oscillator 1 thus fabricated, the gap between the lid 6 and the IC chip 3 is equal to or less than approximately 50 μm. The gap between the lid 6 and the crystal resonator 2 is larger than the gap between the lid 6 and the IC chip 3. In this embodiment, the gap between the lid 6 and the IC chip 3 is 50 μm, while the gap between the lid 6 and the crystal resonator 2 is 100 μm. Also, a dimension of height in X direction from the flat surface of the wall portion corresponding region 491 to the summit of the curved surface of the cavity corresponding region 492 is equal to or less than approximately 30 μm.

As described above, with the crystal oscillator 1 and the base 4 of the crystal oscillator 1 according to this embodiment, the crystal resonator 2 and the IC chip 3 are disposed side by side on the bottom face 441 of the cavity 44 in the non-corresponding state in plan view, so that this can accommodate lowered height applications of the base 4. As a result, this accommodates lowered height applications of the crystal oscillator 1. Since the base 4 is only of two-layer configuration of the bottom portion 41 and the wall portion 42, this accommodates lowered height applications of the crystal oscillator 1.

Also, the crystal oscillator 1 and the base 4 of the crystal oscillator 1 according to the present invention, the wiring patterns 55 include at least the output wiring pattern 551 and the power source wiring pattern 552. The electrode pads 511 and 512 are disposed closer to the power source wiring pattern 552 than the output wiring pattern 551. That is, the electrode pads 511 and 512 are disposed on the bottom face 441 of the cavity 44, apart from the output wiring pattern 551 and close to the power source wiring pattern 552, which can suppress the influence of unnecessary radiation, which is generated from the output wiring pattern 551, on the crystal resonator 2 by separating the electrode pads 511 and 512 electrically coupled to the crystal resonator 2 (specifically, the crystal resonator 2 electrically coupled to the electrode pads 511 and 512) from the output wiring pattern 551 through which an alternating current or a high frequency signal flows. In particular, the intensity (amplitude) of a signal flowing through the output wiring pattern 551 is high, but the influence of unnecessary radiation (radiation noise), which is generated from the output wiring pattern 551, on the crystal resonator 2 can be suppressed by separating the electrode pads 511 and 512 (specifically, the crystal resonator 2 electrically coupled to the electrode pads 511 and 512) from the output wiring pattern 551.

Incidentally, as for the crystal oscillator 1, even when a frequency of the signal flowing through the output wiring pattern 551 and a frequency of the signal flowing through the electrode pads 511 and 512 coupled with the crystal resonator 2 are equal, the phases are shifted. Further, different signal waveforms cause a potential difference, and the difference leads to failure due to the interaction between the output wiring pattern 551 and the electrode pads 511 and 512. In contrast, according to the present embodiment, the electrode pads 511 and 512 (specifically, the crystal resonator 2 electrically coupled to the electrode pads 511 and 512) are separated from the output wiring pattern 551, compared with the power source wiring pattern 552, which can suppress the failure due to the interaction.

Generally, in the fabrication process of the crystal oscillator 1, sputtering is applied to the pair of driving electrodes 24 disposed on both principal surfaces 211 and 212 of the crystal resonator 2, and frequency adjustment of the crystal resonator 2 is carried out with a weight attached according to a deposition method. When the frequency adjustment of the crystal resonator 2 is carried out, there is a case where a fragment of the driving electrodes 24 scattered from the driving electrodes 24 due to the sputtering and materials used for the weight are attached to the output wiring pattern 551 through which the alternating current or the high frequency signal flows. In this case, the surface resistance of the wiring patterns 55 is reduced, which causes failure such as a shirt circuit on the wiring patterns 55. In contrast, according to the present embodiment, as shown in FIGS. 2 and 4, the electrode pads 511 and 512 are disposed closer to the power source wiring pattern 552 than the output wiring pattern 551. Accordingly, when the crystal resonator 2 is electrically coupled to the electrode pads 511 and 512, the crystal resonator 2 is disposed on the bottom face 441 of the cavity 44, apart from the output wiring pattern 551 and close to the power source wiring pattern 552, which provides resistance to failure.

Also, according to the crystal oscillator 1 of the present embodiment, the wiring patterns 55 include at least the output wiring pattern 551, the power source wiring pattern 552, and the ground wiring pattern 554, and the electrode pads 511 and 512 and the connection pads 521, 522, 523, 524, 525, and 526 are disposed on the one principal surface 43 of the base 4, and the wiring patterns 55 are disposed at least on the one principal surface 43 of the base 4, and a part of the IC chip 3 coupled with the connection pad 526 which is conducted to the ground terminal 534 is disposed at a corresponding region on the side of the one principal surface 43 corresponding to the ground terminal 534 disposed on the other principal surface 45, so that the length of the ground wiring pattern 554 can be shortened. As a result, this accommodates lowered height applications of the crystal oscillator 1 and stabilizes the electrical properties of the crystal oscillator 1.

That is, according to the present embodiment, a part of the IC chip 3 coupled with the connection pad 526 which is conducted to the ground terminal 534 is disposed at the corresponding region on the side of the one principal surface 43 corresponding to the ground terminal 534 disposed on the other principal surface 45, so that the length of the ground wiring pattern 554 can be shortened. As a result, the influence of ringing of the output waveform of the crystal oscillator 1, which depends on the length of the ground wiring pattern 554, can be suppressed.

That is, according to the present invention, the configuration is such that the ground terminal 534 and the IC chip 3 coupled to the connection pad 526 are layered one on top of one another (opposite to each other) via the base material of the base 4, and the ground terminal 534 and the IC chip 3 electrically coupled to the connection pad 526 are in a "layered state". Accordingly, the radiation noise from the IC chip 3 electrically coupled to the connection pad 526 is suppressed with the ground terminal 534, which facilitates EMI countermeasures. When the shorter the distance between the ground terminal 534 and the IC chip 3 is or the thinner the thickness of the base 4 is, the more conspicuous these advantageous effects become. In the present embodiment, this accommodates lowered height applications of the crystal oscillator 1.

Also, when the crystal resonator 2 is coupled to the electrode pads 511 and 512 with the conductive bonding material 72, the conductive bonding material 72 on the protrusion portion 56 gathers in space which is a boundary between the protrusion portion 56 and the electrode pads 511 and 512, which can prevent the conductive bonding material 72 from being forced out from the electrode pads 511 and 512. As a result, the flow of the conductive bonding material 72 on another electrode pad 512 (511) disposed in the vicinity of the electrode pad 511 (512) or on the wiring patterns 55 (the power source wiring pattern 552 in the present embodiment) can be prevented, and the short circuit of electrodes of the crystal oscillator 1 can be prevented.

Also, according to the crystal oscillator 1 of the present embodiment, the pair of driving electrodes 24 disposed on the crystal resonator 2 is in the non-corresponding state with respect to the alternating current output terminal 531, the direct current power source terminal 532, the power source wiring pattern 552, and the output wiring pattern 551. As a result, unnecessary capacity formed in the crystal oscillator 1 can be prevented without generating capacitive coupling between the pair of driving electrodes 24 and those terminals and patterns. Also, this prevents the driving electrodes 24 from being affected by harmonics of the alternating current output terminal 531 and the output wiring pattern 551 constituting an oscillation circuit so as to generate noise. Similarly, noise can be suppressed that is generated at the direct current power source terminal 532, the direct current control terminal 533, the ground terminal 534, the power source wiring pattern 552, and the ground wiring pattern 554 that constitute the oscillation circuit.

Also, the wiring patterns 55 coupled to the connection pads 522, 523, 524, and 526 are disposed along the side surface of the IC chip 3 (see reference numbers 32, 33, 34, and 35 shown in FIG. 2). After the IC chip 3 is mounted on the base 4, a gap of the IC chip 3 with respect to the connection pads 522, 523, 524, and 526 can be easily found through an external appearance inspection (in particular, external appearance inspection by the person) based on the positions of the side face of the IC chip 3 and the wiring patterns 55 so as to improve a yield rate.

Also, the crystal resonator 2 and the IC chip 3 are disposed in parallel on the base 4. This makes the distance between the crystal resonator 2 and the base 4 equal to the distance between the IC chip 3 and the base 4, compared with the distance from the base 4 to a vertically arranged structure (a layer-arranged structure). This ensures uniform conduction of external heat (such as heat from the mounting board to the base 4) to the crystal resonator 2 and the IC chip 3. In particular, the crystal resonator 2 and the IC chip 3 are preferably disposed on a uniform thick part of the substrate of the base 4. Separating the crystal resonator 2 and IC chip 3 from one another, compared with the vertically arranged structure, reduces the influence of heat from the IC chip 3 in oscillation to the crystal resonator 2. The crystal oscillator 1 according to this embodiment is useful in not only in SPXO but also in, for example, TCXO.

In this embodiment, the gap between the lid 6 and the IC chip 3 is 50 μm, while the gap between the lid 6 and the crystal resonator 2 is 100 μm. This ensures that even if the lid of the oscillator is subjected to some pressing force at the time of mounting on the board, the IC chip 3 serves as a support for the lid 6 to prevent the lid 6 from contacting the crystal resonator 2.

In the crystal oscillator 1 according to the present invention, when the lid 6 is transformed, the lid 6 is transformed in such a manner that a portion of the vicinity of the center of the cavity 44 is dented. Even if the lid 6 is transformed in this manner, non-oscillation can be prevented that is caused by contact of the lid 6 with the crystal resonator 2 or the conductive bonding material 72 that bonds the crystal resonator 2, for the reason that the electrode pads 511 and 512 coupled to the crystal resonator 2 are disposed, not on the vicinity of the center of the cavity 44, but on the close vicinity of the outer circumference of the cavity 44 in plan view.

While in this embodiment the crystal oscillator is applied as the piezoelectric resonator device, the material should not be limited to the crystal but may be applied to piezoelectric materials. This should not be limited to the crystal oscillator according to the present invention. Examples may include an oscillator using a surface acoustic wave device.

Also, the present embodiment is applied to the four-terminal constitution wherein the alternating current output terminal 531 of the IC chip 3 as the external terminals 53, the direct current power source terminal 532, the direct current control terminal 533, and the ground terminal 534 are included, but not limited to this. Another four-terminal constitution may be of one wherein a voltage control terminal is disposed, instead of the direct current control terminal 533. Also, another four-terminal constitution may be of one wherein a dummy terminal that does not function as a terminal to couple outside may be disposed, instead of the direct current control terminal 533. Also, a constitution may be of one wherein five terminals or more are provided that include at least two terminals or more, out of the direct current control terminal 533, the voltage control terminal, and the dummy terminal. Also, a constitution may be of one wherein six terminals or more are provided that include the external terminals 53 including another write terminal and the like as an additional terminal.

Also, in the present embodiment, the two via holes 48 are disposed on the base 4, but this should not be construed in a limited sense. The number of via holes may arbitrarily be set.

Also, while in the present embodiment the package of the crystal oscillator 1 is defined by the base 4 in the form of a box and the lid 6 in the form of a single plate, this should not be construed in a limiting sense. The package of the oscillator may be of a sandwich structure in which the base 4, the crystal resonator 2, and the lid 6 are layered.

While in this embodiment the present invention is applied to the base 4, this should not be construed in a limiting sense; the present invention may also be applied to the lid 6, in which the crystal resonator 2 and the IC chip 3 are mounted, and the wiring patterns 55 and the like are disposed.

While in this embodiment the bonding material is disposed on the lid 6 prior to the bonding of the base 4 and the lid 6, this should not be construed in a limiting sense; the bonding material may also be disposed on the base 4.

While in this embodiment the oscillating portion 22 and the bonding portion 23 have the same thickness, this should not be construed in a limiting sense; the oscillating portion 22 may be thinner so as to adapt to high frequency applications.

While in this embodiment the protrusion portion 56 is disposed in the close vicinity of the short side of the electrode pads 511 and 512 along the short side direction, this should not be construed in a limiting sense. The protrusion portion 56 may be provided on any one of sides on the electrode pads 511 and 512, for example, in the close vicinity of the long side along the long side direction.

Figure 5:
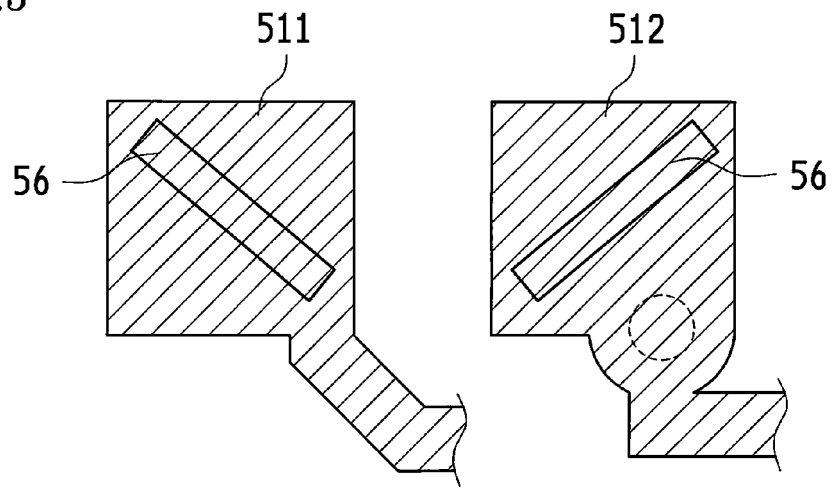
FIG. 5 is a schematic plan view of electrode pads according to another embodiment.
Figure 6:
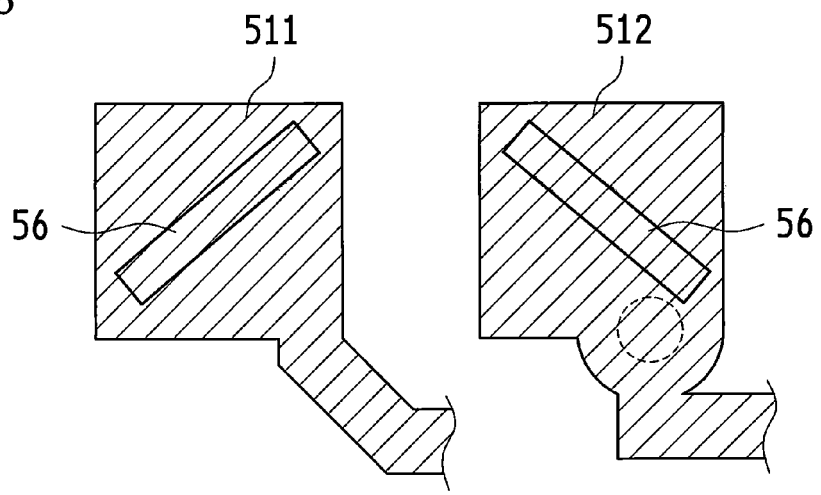
FIG. 6 is a schematic plan view of electrode pads according to another embodiment.

While in this embodiment the protrusion portion 56 is disposed in the close vicinity of the short side of the electrode pads 511 and 512 along the short side direction, this should not be construed in a limiting sense. As shown in FIGS. 5 and 6, the protrusion portion 56 may be provided on the electrode pads 511 and 512 along the diagonal line.

Figure 7:
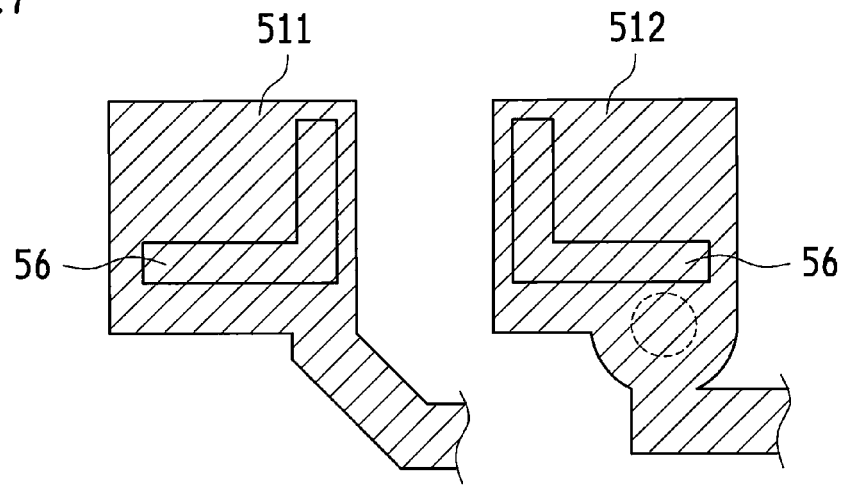
FIG. 7 is a schematic plan view of electrode pads according to another embodiment.

While in this embodiment the protrusion portion 56 is disposed in the close vicinity of the short side of the electrode pads 511 and 512 along the short side direction, this should not be construed in a limiting sense. As shown in FIG. 7, the protrusion portion 56 formed in an L-shape in plan view may be provided.

Figure 8:
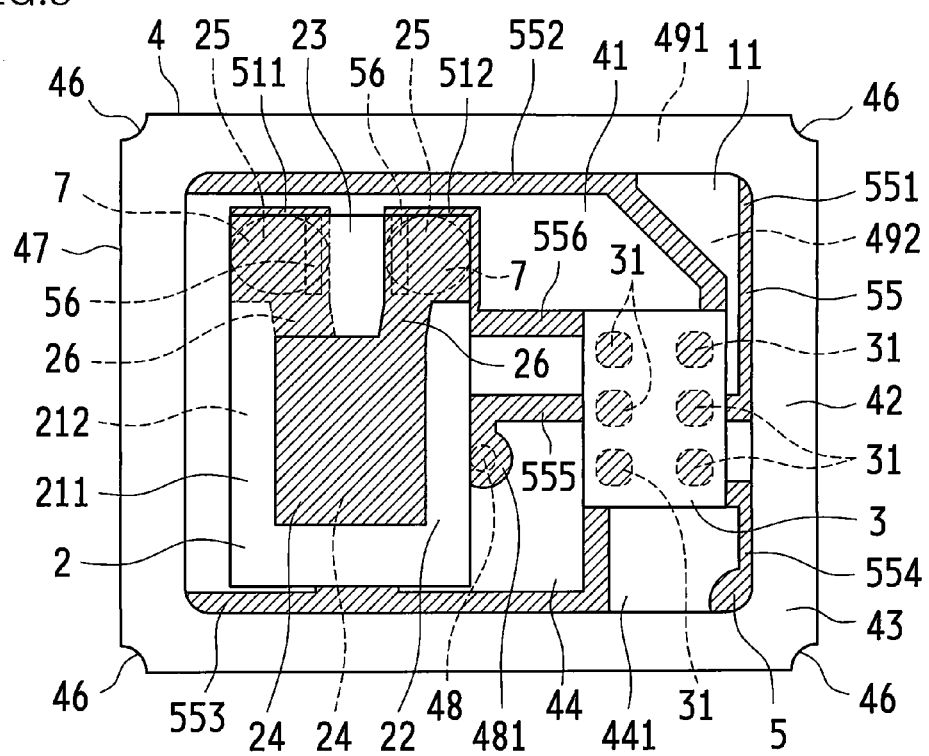
FIG. 8 is a schematic plan view of a base according to another embodiment with a crystal resonator and an IC chip mounted on the base.

While in this embodiment the connection pad 526 which is conducted to the ground terminal 534 is disposed at the corresponding region on the one principal surface 43 corresponding to the ground terminal 534 disposed on the other principal surface 45, this should not be construed in a limiting sense. As shown in FIG. 8, the connection pads 525 and 526 that are conducted to the ground terminal 534 and the alternating current output terminal 531 may be disposed between the corresponding region on the one principal surface 43 corresponding to the ground terminal 534 disposed on the other principal surface 45 and the corresponding region on the one principal surface 43 corresponding to the alternating current output terminal 531 disposed on the other principal surface 45. In this case, both lengths of the ground wiring pattern 554 and the output wiring pattern 551 can be also shortened. As a result, the influence of ringing of the output waveform of the crystal oscillator 1, which depends on the lengths of the ground wiring pattern 554 and the output wiring pattern 551, can be suppressed.

As shown in FIG. 4, while in this embodiment the connection pads 521, 522, 523, 524, 525, and 526 are disposed in a matrix shape (3×2) on the bottom face 441 of the cavity 44 of the one principal surface 43 of the base 4, with the base 4 in plan view, and the m arrangement direction is the short side direction of the cavity 44, this should not be construed in a limiting sense. On condition of (m<n), a plurality of connection pads may be disposed in the (m×n) matrix shape on the bottom face 441 of the cavity 44, and the n arrangement direction (a column direction) may be a long side direction of the cavity 44. For example, as shown in FIG. 9, it may be such that the disposition of the IC chip 3 with respect to the base 4 is rotated through 90 degrees, compared with the mode shown in FIG. 1, and the IC chip 3 is disposed corresponding to the disposition of the base 4, and the connection pads 521, 522, 523, 524, 525, and 526 are disposed in a (2×3) matrix shape on the bottom face 441 of the cavity 44, and the n arrangement direction is the long side direction of the cavity 44.

Figure 9:
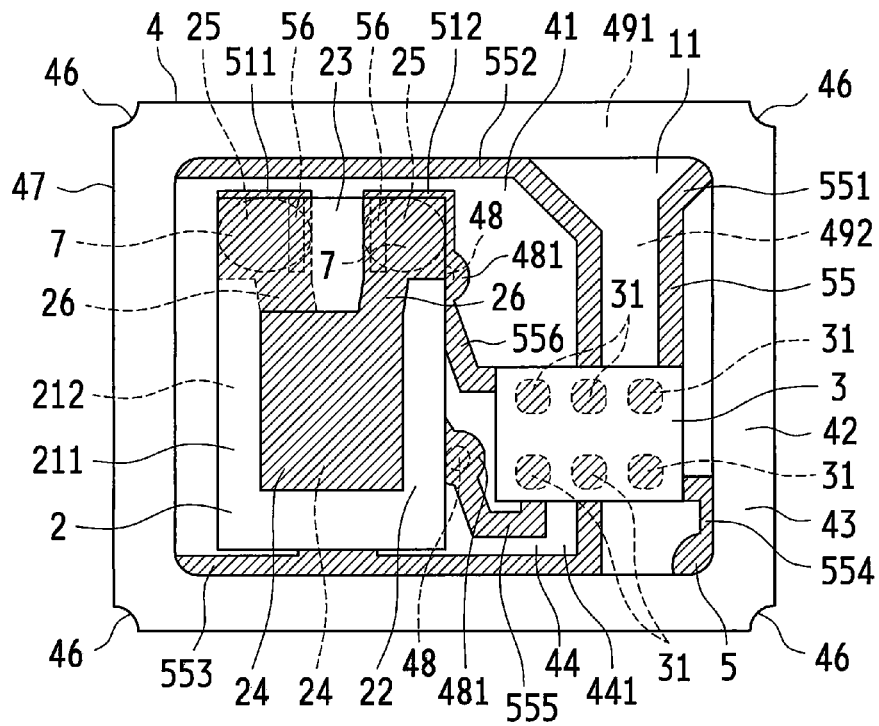
FIG. 9 is a schematic plan view of a base according to the another embodiment with a crystal resonator and an IC chip mounted on the base.
Figure 10:
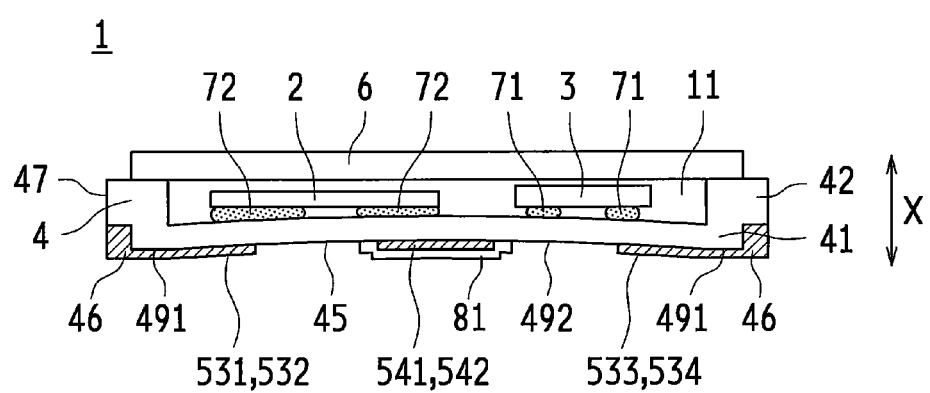
FIG. 10 is a schematic side view of a crystal oscillator according to a second embodiment, for illustrating an internal space of the crystal oscillator.

In the case of the embodiment shown in FIG. 9, the bottom face 441 of the cavity 44 is formed in an approximately rectangular shape and is of the curved surface, the connection pads 521, 522, 523, 524, 525, and 526 are disposed in the matrix shape (2×3; m×n) on the bottom face 441 of the cavity 44 with the base 4 in plan view, and the n arrangement direction is the long side direction of the cavity 44. When the IC chip 3 is mounted on the connection pads 521, 522, 523, 524, 525, and 526 according to FCB method, all the connection pads 521, 522, 523, 524, 525, and 526 are connected with the IC chip 3 (terminals 31 such as the Au bump disposed on the IC chip 3). In this case, the float of the IC chip 3 (terminals 31 such as the Au bump disposed on the IC chip 3) with respect to the connection pads 521, 522, 523, 524, 525, and 526 can be prevented. Also, when the IC chip 3 is mounted on the connection pads 521, 522, 523, 524, 525, and 526 according to FCB method, the destabilization of the bonding of the IC chip 3 with the connection pads 521, 522, 523, 524, 525, and 526 can be prevented.

In this embodiment, the gap between the lid 6 and the IC chip 3 is 50 μm, while the gap between the lid 6 and the crystal resonator 2 is 100 μm. This, however, should not be construed in a limiting sense. All that is necessary is that the gap between the lid 6 and the IC chip 3 be equal to or less than 50 μm, and that the gap between the lid 6 and the crystal resonator 2 be larger than the gap between the lid 6 and the IC chip 3. Accordingly, no gap (0 μm) may exist between the lid 6 and the IC chip 3, while a gap may exist between the lid 6 and the crystal resonator 2. For example, the lower surface of the lid 6 facing the base 4 may have a flat surface, and the upper surface of the IC chip 3 may contact the lower surface of the lid 6. The lid 6 may also be curved toward the base 4 side, or the lower surface of the lid 6 may be convexly curved, and the upper surface of the IC chip 3 may contact the lower surface of the lid 6. This efficiently discharges heat of the IC chip 3 to outside the oscillator 1 through the lid 6, which is effective for stable operation of the oscillator 1. This is also an optimal configuration for EMI countermeasure.

<Second Embodiment>

Next, a crystal oscillator 1 according to a second embodiment will be described below by referring to the accompanying drawings. The crystal oscillator 1 according to the second embodiment is different from the first embodiment in the base 4. However, where the second embodiment has a configuration in common with the first embodiment, the advantageous effects and modifications of the configuration of the second embodiment are similar to the advantageous effects and the modifications of the first embodiment. In view of this, in the second embodiment, description will be given with regard to the base 4 in different respects from the first embodiment, while the other respects that are shared in common will not be elaborated.

As shown in FIGS. 10 to 13, the electrode 5 of the base 4 includes a pair of electrode pads 511 and 512 that are electrically and mechanically coupled to the respective driving electrodes 24 of the crystal resonator 2, connection pads 521, 522, 523, 524, 525, and 526 that are electrically coupled to respective terminals 31 of the IC chip 3, external terminals 53 (the alternating current output terminal 531, the direct current power source terminal 532, the direct current control terminal 533, and the ground terminal 534) that are to be electrically coupled to an external device such as an external circuit board (not shown) with a conductive bonding material such as a solder (not shown), and inspection terminals 541 and 542 that measure and inspect the properties of the crystal resonator 2.

The electrode pads 511 and 512 and the connection pads 521, 522, 523, 524, 525, and 526 are disposed on a common plane, on the bottom face 441 of the cavity 44 of the one principal surface 43 of the base 4 (specifically, on the bottom portion 41 of the base 4).

The alternating current output terminal 531, the direct current power source terminal 532, the direct current control terminal 533, and the ground terminal 534 are disposed in the wall portion corresponding region 491 of the other principal surface 45 (outer periphery of the other principal surface 45), and partly disposed in the cavity corresponding region 492 of the other principal surface 45 (center position with the outer periphery of the other principal surface 45 excluded). Specifically, the alternating current output terminal 531, the direct current power source terminal 532, the direct current control terminal 533, and the ground terminal 534 are disposed on the corners and the castellations 46 of the other principal surface 45. While in this embodiment the alternating current output terminal 531, the direct current power source terminal 532, the direct current control terminal 533, and the ground terminal 534 are partly disposed in the cavity corresponding region 492, this should not be construed in a limiting sense. All that is necessary is that the alternating current output terminal 531, the direct current power source terminal 532, the direct current control terminal 533, and the ground terminal 534 be disposed in the wall portion corresponding region 491 of the other principal surface 45 (the outer periphery of the other principal surface 45). It is also possible to dispose the alternating current output terminal 531, the direct current power source terminal 532, the direct current control terminal 533, and the ground terminal 534 only in the wall portion corresponding region 491 of the other principal surface 45.

Figure 13:
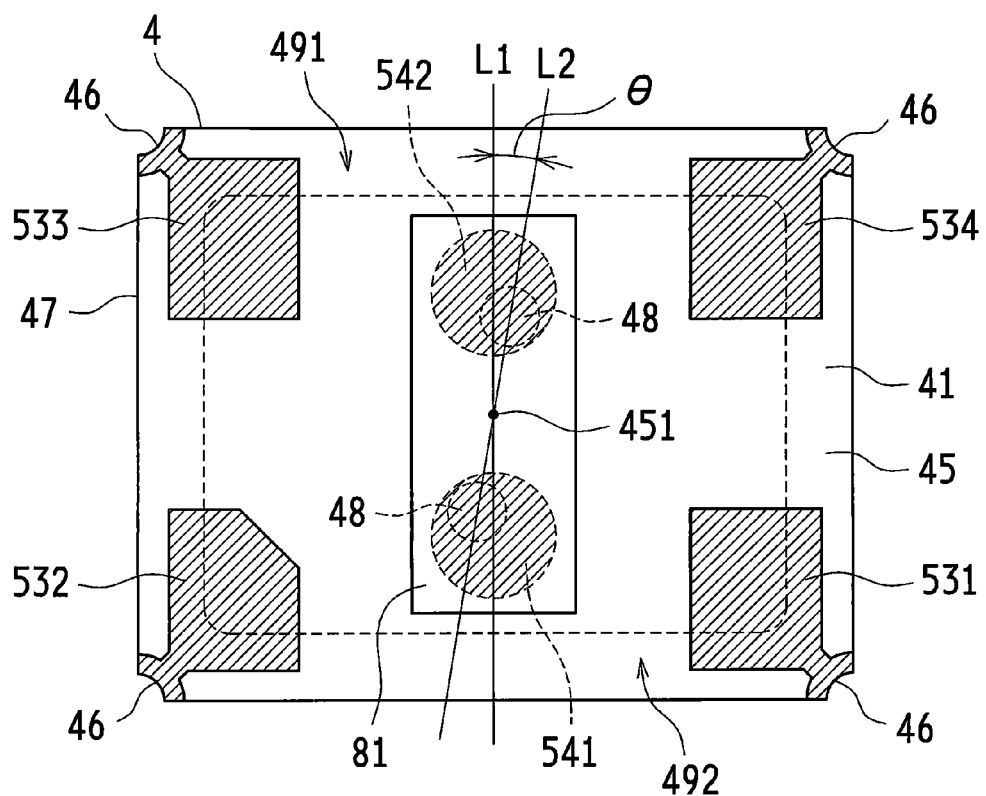
FIG. 13 is a schematic rear view of the base according to the second embodiment.
Figure 14:
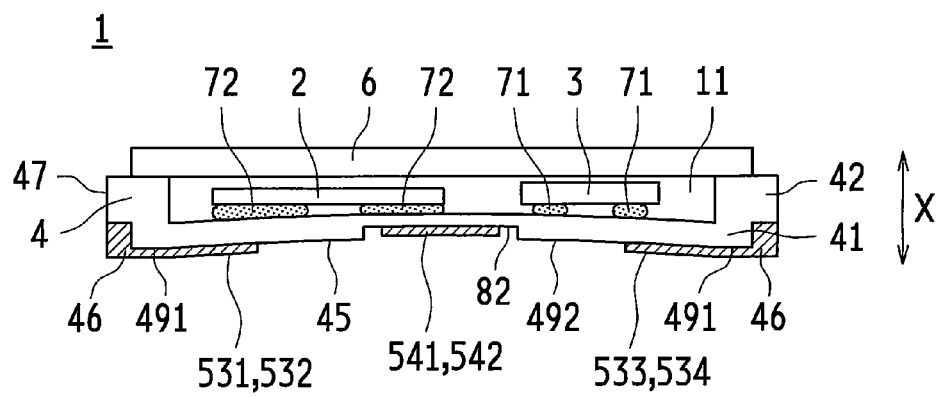
FIG. 14 is a schematic side view of a crystal oscillator according to a third embodiment, for illustrating an internal space of the crystal oscillator.

The inspection terminals 541 and 542 are disposed only in the cavity corresponding region 492 of the other principal surface 45 (center position with the outer periphery of the other principal surface 45 excluded), and are circular shaped in plan view as shown in FIG. 13. Specifically, the inspection terminals 541 and 542 are disposed at a center position of the other principal surface 45 in the long side direction and disposed side by side along the short side direction of the other principal surface 45. Under the inspection terminals 541 and 542, the respective via holes 48 are disposed. Each via hole 48 is deviated from the center of the inspection terminal 541 or 542. An insulating portion 81 of insulating material such as resist is disposed over the inspection terminals 541 and 542. The insulating portion 81 prevents exposure of the inspection terminals 541 and 542 after the fabrication of the crystal oscillator 1, and thus prevents contact of the inspection terminals 541 and 542 with a terminal of another electronic device. This eliminates the need for forming the base 4 into a depressed shape (depressed portion 82), as described in the third embodiment below (see FIG. 14). This prevents contact of the inspection terminals 541 and 542 with a terminal of another electronic device without degrading the strength of the base 4. The insulating portion 81 is not limited to this embodiment, any other materials and shapes may arbitrarily be selected insofar as the inspection terminals 541 and 542 are covered.

Figure 12:
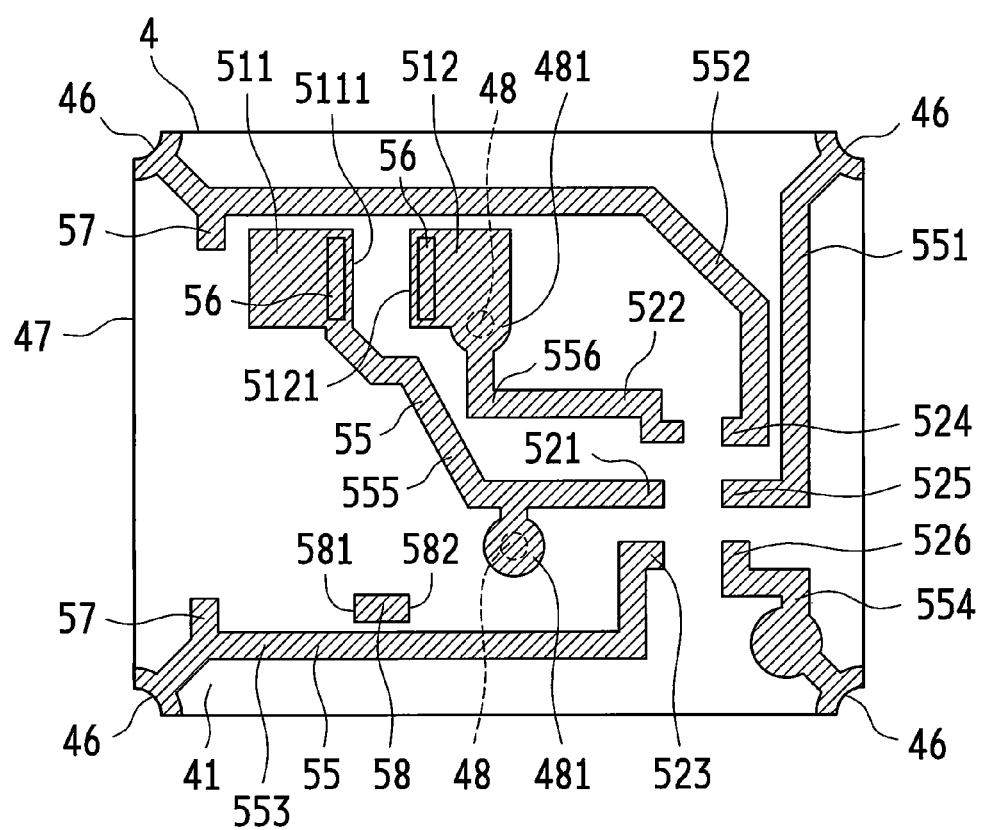
FIG. 12 is a schematic plan view of the base (bottom portion) according to the second embodiment, for illustrating electrode patterns.

Also, as shown in FIG. 12, the wiring patterns 55 include the output wiring pattern 551 to establish electrical continuity between the connection pad 525 and the alternating current output terminal 531 of the IC chip 3, the power source wiring pattern 552 to establish electrical continuity between the connection pad 524 and the direct current power source terminal 532, the control wiring pattern 553 to establish electrical continuity between the connection pad 523 and the direct current control terminal 533, the ground wiring pattern 554 to establish electrical continuity between the connection pad 526 and the ground terminal 534, the inspection wiring patterns 555 to establish electrical continuity between the connection pad 521 and the inspection terminals 542 and the electrode pad 511, and the inspection wiring pattern 556 to establish electrical continuity between the connection pad 522 and the inspection terminal 541 and the electrode pad 512, thereby the electrode pads 511 and 512, and the connection pads 521, 522, 523, 524, 525, and 526 can be conducted. In the present embodiment, as is different from the first embodiment described above, the boss portion 58 that is dedicated to the crystal resonator 2 and continuous along the wiring pattern 553 is not disposed on the control wiring pattern 553 that couples the connection pad 523 to the direct current control terminal 533, but the boss portion 58 is disposed on the base 4, apart from the control wiring pattern 553.

The electrode pads 511 and 512, the connection pads 521 and 522, and the inspection terminals 541 and 542 in the above-described configuration are electrically coupled to each other by way of the via holes 48 and wiring patterns 55 (inspection wiring patterns 555 and 556). The connection pads 523, 524, 525, and 526 and the alternating current output terminal 531, the direct current power source terminal 532, the direct current control terminal 533, and the ground terminal 534 are electrically coupled to each other via the wiring patterns 55 (the output wiring pattern 551, the power source wiring pattern 552, the control wiring pattern 553, and the ground wiring pattern 554).

Figure 11:
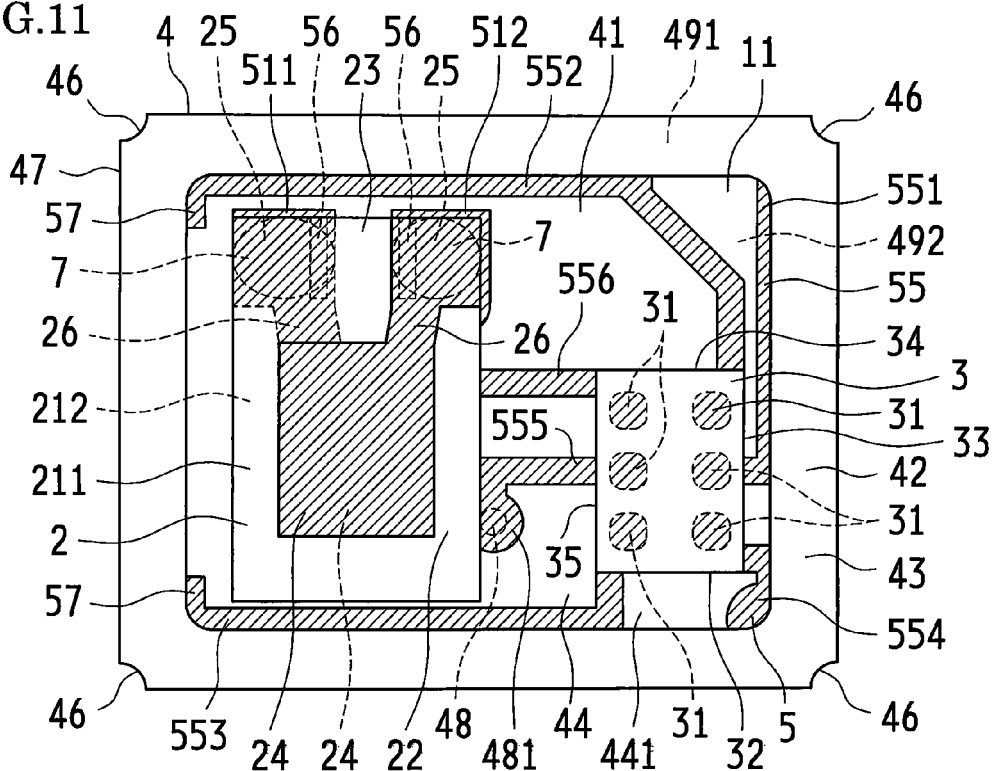
FIG. 11 is a schematic plan view of a base according to the second embodiment with a crystal resonator and an IC chip mounted on the base.

The electrode 5 includes a pair of recognition portions 57 for image recognition in the fabrication process of the crystal oscillator 1. The pair of recognition portions 57 are disposed on the control wiring pattern 553 that couples the connection pad 523 to the direct current control terminal 533 (external terminals) and on the power source wiring pattern 552 that couples the connection pad 524 to the direct current power source terminal 532 (external terminals). As shown in FIGS. 11 and 12, the recognition portions 57 are partly exposed in the cavity 44 and formed along the short side direction of the base 4. The recognition portions 57 serve as a mounting basis for mounting the crystal resonator 2 and the IC chip 3 to the base 4. This ensures precise mounting of the crystal resonator 2 and the IC chip 3 on the base 4. This, as a result, reduces misaligned mounting of the crystal resonator 2 and the IC chip 3 on the base 4, and facilitates the attempt to improve productivity, such as improving the yield rate. The recognition portions 57 are not limited to this embodiment, and any other configuration is possible insofar as they are formed in pairs.

A boss portion 58 for the crystal resonator 2 is disposed along and separated from the control wiring pattern 553 that couples the connection pad 523 to the direct current control terminal 533. The boss portion 58 is formed along with the control wiring pattern 553. The boss portion 58 also functions as a portion for recognition, similarly to the recognition portions 57. With respect to the function of recognition, one end edge 581 of the boss portion 58 and one end edge 5111 of the electrode pad 511 are disposed along the short side direction of the base 4, and the other end edge 582 of the boss portion 58 and an end edge 5121 of the electrode pad 512 are disposed along the short side direction of the base 4. The boss portion 58 and the electrode pads 511 and 512 serve as a mounting basis for mounting the crystal resonator 2 and the IC chip 3 on the base 4. This ensures precise mounting of the crystal resonator 2 and the IC chip 3 on the base 4. This, as a result, reduces misaligned mounting of the crystal resonator 2 and the IC chip 3 on the base 4, and facilitates the attempt to improve productivity, such as improving the yield rate.

<Third Embodiment>

Next, a crystal oscillator 1 according to a third embodiment will be described below by referring to the accompanying drawings. The crystal oscillator 1 according to the third embodiment is different from the first embodiment in the base 4. However, where the third embodiment has a configuration in common with the first embodiment, the advantageous effects and modifications of the configuration of the third embodiment are similar to the advantageous effects and the modifications of the first embodiment. In view of this, in the third embodiment, description will be given with regard to the base 4 in different respects from the first embodiment, while the other respects that are shared in common will not be elaborated.

As shown in FIGS. 14 to 17, the electrode 5 of the base 4 includes a pair of electrode pads 511 and 512 that are electrically and mechanically coupled to the respective driving electrodes 24 of the crystal resonator 2, the connection pads 521, 522, 523, 524, 525, and 526 that are electrically coupled to respective terminals 31 of the IC chip 3, the alternating current output terminal 531, the direct current power source terminal 532, the direct current control terminal 533, and the ground terminal 534 that are to be electrically coupled to an external device such as an external circuit board (not shown) with a conductive bonding material such as a solder (not shown), and inspection terminals 541 and 542 that measure and inspect the properties of the crystal resonator 2.

The electrode pads 511 and 512 and the connection pads 521, 522, 523, 524, 525, and 526 are disposed on a common plane, on the bottom face 441 of the cavity 44 of the one principal surface 43 of the base 4 (specifically, on the bottom portion 41 of the base 4).

Also, the alternating current output terminal 531, the direct current power source terminal 532, the direct current control terminal 533, and the ground terminal 534 are disposed in the wall portion corresponding region 491 of the other principal surface 45 (outer periphery of the other principal surface 45), and a part of those terminals are disposed in the cavity corresponding region 492 of the other principal surface 45 (center position with the outer periphery of the other principal surface 45 excluded). Specifically, the alternating current output terminal 531, the direct current power source terminal 532, the direct current control terminal 533, and the ground terminal 534 are disposed on the corners and the castellations 46 of the other principal surface 45. It is noted that while in the present embodiment the alternating current output terminal 531, the direct current power source terminal 532, the direct current control terminal 533, and the ground terminal 534 are partly disposed in the cavity corresponding region 492, this should not be construed in a limiting sense. All that is necessary is that the alternating current output terminal 531, the direct current power source terminal 532, the direct current control terminal 533, and the ground terminal 534 be disposed in the wall portion corresponding region 491 of the other principal surface 45 (the outer periphery of the other principal surface 45). It is also possible to dispose the alternating current output terminal 531, the direct current power source terminal 532, the direct current control terminal 533, and the ground terminal 534 only in the wall portion corresponding region 491 of the other principal surface 45.

Figure 17:
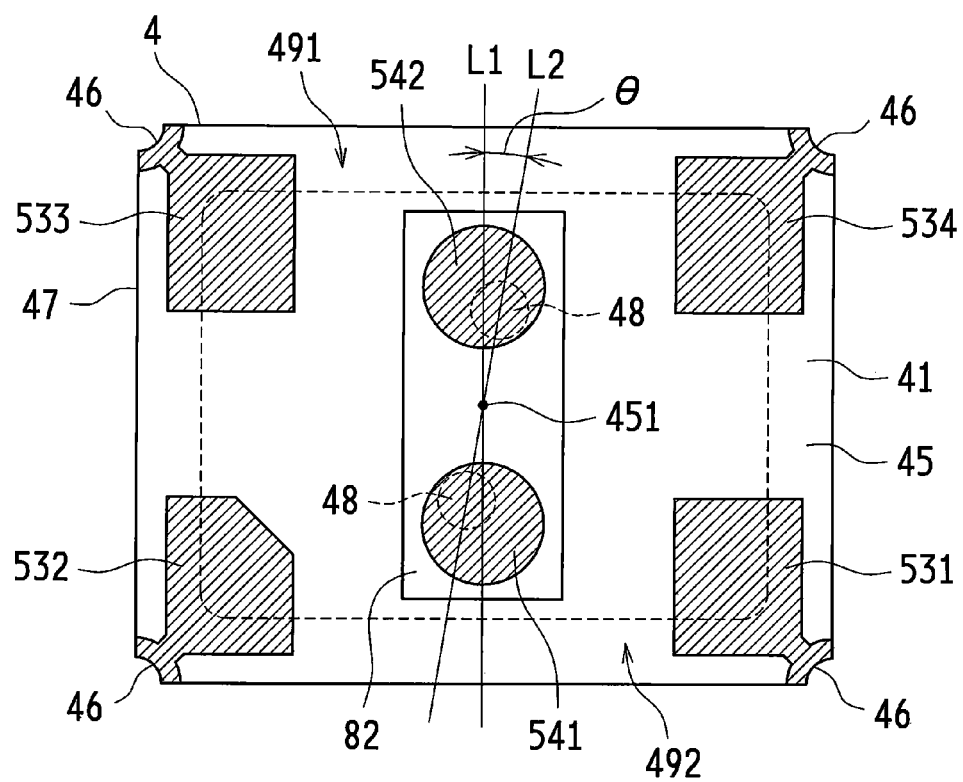
FIG. 17 is a schematic rear view of the base according to the third embodiment.
Figure 18:
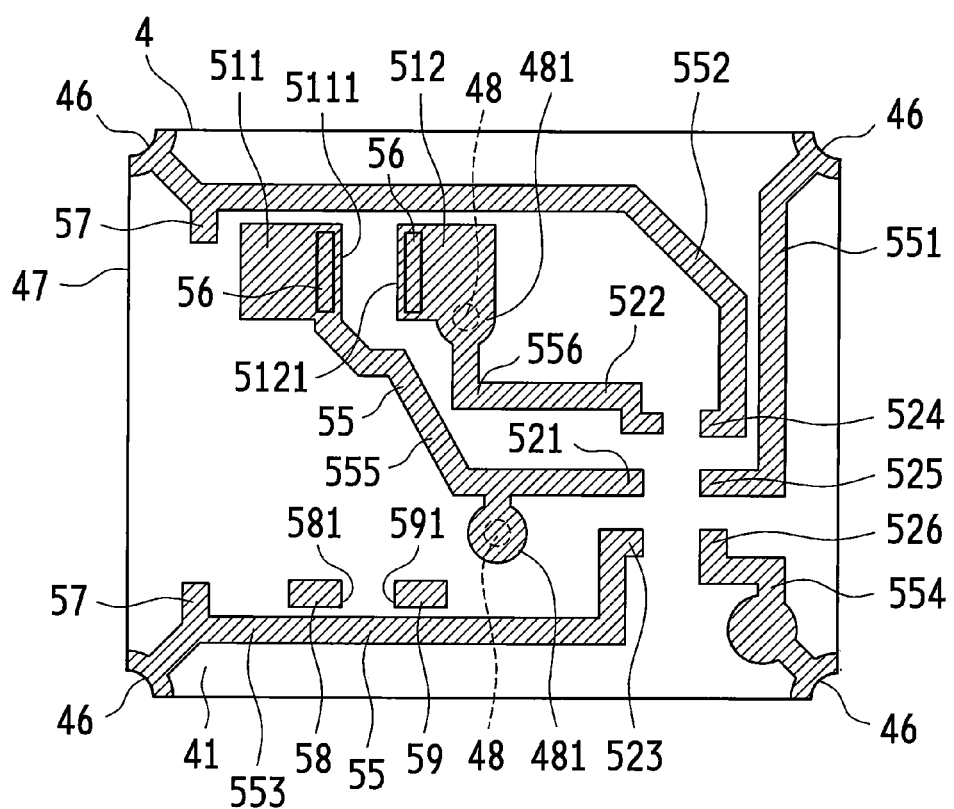
FIG. 18 is a schematic plan view of a base (bottom portion) according to another embodiment, for illustrating electrode patterns.

The inspection terminals 541 and 542 are disposed only in the cavity corresponding region 492 of the other principal surface 45 (center position with the outer periphery of the other principal surface 45 excluded), and are circular shaped in plan view as shown in FIG. 17. Specifically, the inspection terminals 541 and 542 are disposed at a center position of the other principal surface 45 in the long side direction and disposed side by side along the short side direction of the other principal surface 45. Under the inspection terminals 541 and 542, the via holes 48 are disposed respectively. Each via hole 48 is deviated from the center of the inspection terminal 541 or 542. Also, the inspection terminals 541 and 542 are disposed in the depressed portion 82 formed on the other principal surface 45 of the base 4. After the fabrication of the crystal oscillator 1, the depressed portion 82 allows the inspection terminals 541 and 542 to be arranged above in the X direction with respect to the alternating current output terminal 531, the direct current power source terminal 532, the direct current control terminal 533, and the ground terminal 534. When the alternating current output terminal 531, the direct current power source terminal 532, the direct current control terminal 533, and the ground terminal 534 are connected to terminals of another electronic device and the like, the connection of the inspection terminals 541 and 542 with the terminals of another electronic device and the like can be prevented. Also, the third embodiment eliminates the need for the resist processing, as required in the second embodiment (see FIG. 10). Thus, compared with the second embodiment, the third embodiment eliminates the step of the resist processing and thus costs less in providing similar advantageous effects. The depressed portion 82 is not limited to this embodiment, and any other shape is possible insofar as the inspection terminals 541 and 542 are disposed in the depressed portion 82.

Figure 16:
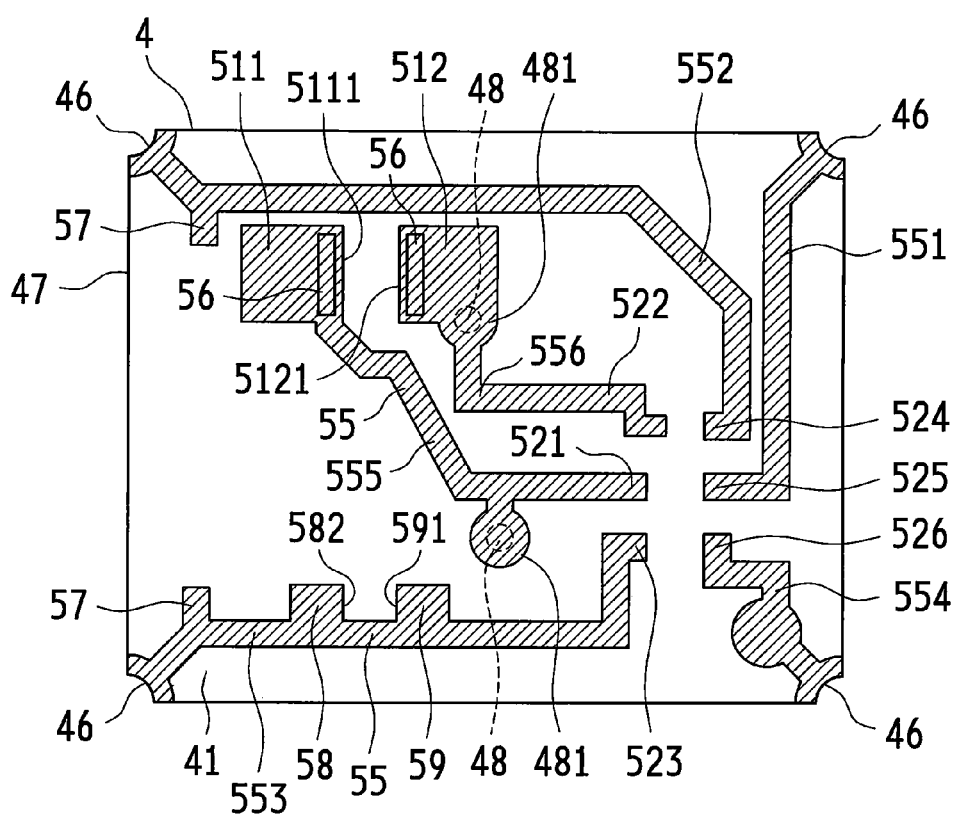
FIG. 16 is a schematic plan view of the base (bottom portion) according to the third embodiment, for illustrating electrode patterns.

As shown in FIG. 16, the wiring patterns 55 include the output wiring pattern 551 to establish electrical continuity between the connection pad 525 and the alternating current output terminal 531 of the IC chip 3, the power source wiring pattern 552 to establish electrical continuity between the connection pad 524 and the direct current power source terminal 532, the control wiring pattern 553 to establish electrical continuity between the connection pad 523 and the direct current control terminal 533, the ground wiring pattern 554 to establish electrical continuity between the connection pad 526 and the ground terminal 534, the inspection wiring pattern 555 to establish electrical continuity between the connection pad 521 and the inspection terminal 542 and the electrode pad 511, and the inspection wiring pattern 556 to establish electrical continuity between the connection pad 522 and the inspection terminal 541 and the electrode pad 512, thereby the electrode pads 511 and 512, and the connection pads 521, 522, 523, 524, 525, and 526 can be conducted.

The electrode pads 511 and 512, the connection pads 521 and 522, and the inspection terminals 541 and 542 in the above-described configuration are electrically coupled to each other by way of the via holes 48 and wiring patterns 55 (inspection wiring patterns 555 and 556). The connection pads 523, 524, 525, and 526 and the alternating current output terminal 531, the direct current power source terminal 532, the direct current control terminal 533, and the ground terminal 534 are electrically coupled to each other via the wiring patterns 55 (the output wiring pattern 551, the power source wiring pattern 552, the control wiring pattern 553, and the ground wiring pattern 554).

Figure 15:
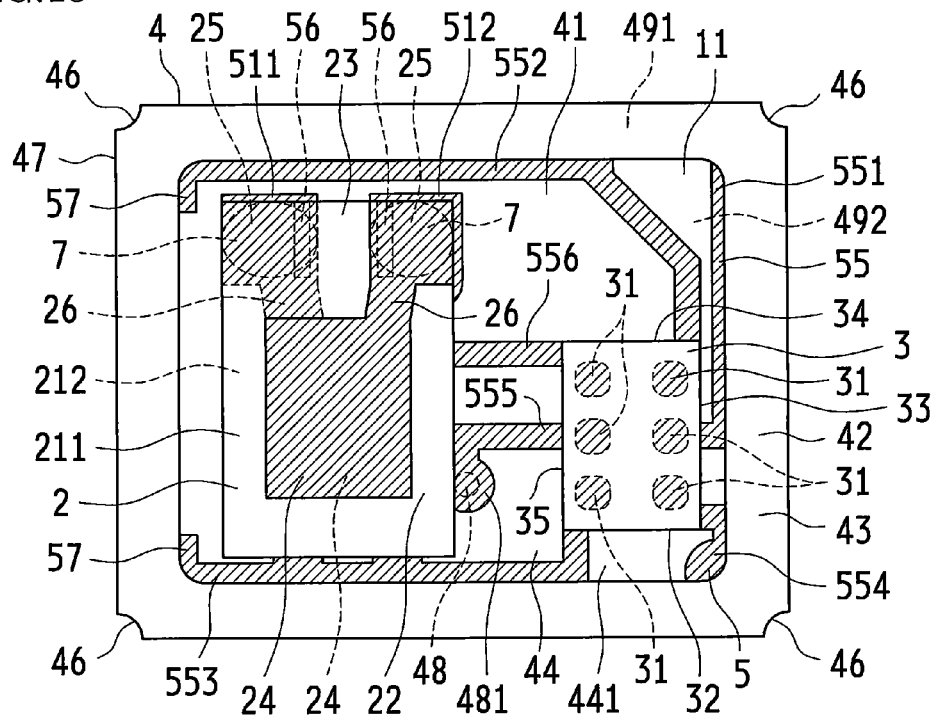
FIG. 15 is a schematic plan view of a base according to the third embodiment with a crystal resonator and an IC chip mounted on the base.

The electrode 5 includes a pair of recognition portions 57 for image recognition in the fabrication process of the crystal oscillator 1. The pair of recognition portions 57 are disposed on the control wiring pattern 553 that couples the connection pad 523 to the direct current control terminal 533 (external terminals) and on the power source wiring pattern 552 that couples the connection pad 524 to the direct current power source terminal 532 (external terminals). As shown in FIGS. 15 and 16, the recognition portions 57 are partly exposed in the cavity 44 and formed along the short side direction of the base 4. The recognition portions 57 serve as a mounting basis for mounting the crystal resonator 2 and the IC chip 3 to the base 4. This ensures precise mounting of the crystal resonator 2 and the IC chip 3 on the base 4. This, as a result, reduces misaligned mounting of the crystal resonator 2 and the IC chip 3 on the base 4, and facilitates the attempt to improve productivity, such as improving the yield rate. The recognition portions 57 are not limited to this embodiment, and any other configuration is possible insofar as they are formed in pairs.

As is different from the first embodiment, in this embodiment, two boss portions 58 and 59 for the crystal resonator 2 are disposed on the control wiring pattern 553 that couples the connection pad 523 to the direct current control terminal 533, and are continuous along the control wiring pattern 553. The boss portions 58 and 59 are formed along with the control wiring pattern 553. The boss portions 58 and 59 also function as a portion for recognition, similarly to the recognition portions 57. With respect to the function of recognition, one end edge (the other end edge 582) of the boss portion 58 and an end edge 5111 of the electrode pad 511 are disposed along the short side direction of the base 4, and the other end edge 591 of the boss portion 59 and an end edge 5121 of the electrode pad 512 are disposed along the short side direction of the base 4. The boss portions 58 and 59 and the electrode pads 511 and 512 serve as a mounting basis for mounting the crystal resonator 2 and the IC chip 3 on the base 4. This ensures precise mounting of the crystal resonator 2 and the IC chip 3 on the base 4. This, as a result, reduces misaligned mounting of the crystal resonator 2 and the IC chip 3 on the base 4, and facilitates the attempt to improve productivity, such as improving the yield rate.

While the two boss portions 58 and 59 are shown in FIG. 16, this should not be construed in a limiting sense. As shown in FIG. 17, two boss portions 58 and 59 for the crystal resonator 2 may be disposed along the control wiring pattern 553 that couples the connection pad 523 to the alternating current output terminal 531 and separated from the control wiring pattern 553. This case provides similar advantageous effects as is the case with the boss portions 58 and 59 shown in FIG. 16. According to the constitution shown in FIG. 17, the two boss portions 58 and 59 for the crystal resonator 2 are disposed along the control wiring pattern 553 that couples the connection pad 523 to the direct current control terminal 533 and separated from the control wiring pattern 553, so that the crystal resonator 2 can be held in a separated manner from the control wiring pattern 553, thereby preventing a short circuit between the control wiring pattern 553 and the driving electrodes 24.

The present invention can be embodied and practiced in other different forms without departing from the spirit, scope, and essential characteristics of the present invention. Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

This application claims priority to Patent Application No. 2010-134302 filed in Japan on Jun. 11, 2010, which is hereby incorporated by reference in its entirety by claiming the priority.

INDUSTRIAL APPLICABILITY

The present invention finds applications in piezoelectric resonator devices such as crystal oscillators.

DESCRIPTION OF THE REFERENCE NUMERAL

1 Crystal oscillator (Piezoelectric resonator device)
11 Internal space
2 Crystal resonator (Piezoelectric resonator)
211 One principal surface
212 Other principal surface
22 Oscillating portion
23 Bonding portion
24 Driving electrode
25 Terminal electrode
26 Extraction electrode
3 IC chip (Electronic component element)
31 Terminal
32 Lower side surface
33 Right side surface
34 Upper side surface
35 Left side surface
4 Base (Sealing member)
41 Bottom portion
42 Wall portion
43 One principal surface
44 Cavity
441 Bottom face
45 Other principal surface
451 Center point
46 Castellation
47 Side surface of casing
48 Via hole
481 Conducting member
491 Wall portion corresponding region
492 Cavity corresponding region
5 Electrode
511 Electrode pad
5111 End edge
512 Electrode pad
5121 End edge
521, 522, 523, 524, 525, 526 Connection pads
53 External terminal
531 Alternating current output terminal
532 Direct current power source terminal 533 Direct current control terminal
534 Ground terminal
541, 542 Inspection terminals
55 Wiring pattern
551 Output wiring pattern
552 Power source wiring pattern
553 Control wiring pattern
554 Ground wiring pattern
555, 556 Inspection wiring patterns
56 Protrusion portion
56 Boss portion
581 One end edge
582 Other end edge
57 Recognition portion
58 Boss portion
581 End edge
59 Boss portion
591 End edge
6 Lid (Sealing member)
7 Conductive bonding material
71 Conductive bump
72 Conductive bonding material
81 Insulating portion
82 Depressed portion
L1, L2 Lines

The invention claimed is:

1. An oscillator comprising:
a sealing member;
a pair of electrode pads configured to electrically couple a piezoelectric resonator that effects piezoelectrical vibration;
a plurality of connection pads configured to electrically couple an integrated circuit element constituting an oscillation circuit with the piezoelectric resonator; and
wiring patterns configured to establish electrical continuity between the pair of electrode pads and the plurality of connection pads,
wherein the piezoelectric resonator and the integrated circuit element are disposed side by side in plan view,
the wiring patterns further comprising:
an output wiring pattern configured to establish electrical continuity between one of the connection pads and an alternating current output terminal of the oscillation circuit; and
a power source wiring pattern configured to establish electrical continuity between one of the connection pads and a direct current power source terminal of the oscillation circuit,
wherein the electrode pads and the connection pads are disposed on one principal surface of a base material constituting the sealing member, and the wiring patterns are disposed at least on the one principal surface of the base material constituting the sealing member,
wherein the power source wiring pattern has an extended portion which extends along a direction of the piezoelectric resonator and the integrated circuit element,
wherein on the one principal surface, the pair of electrode pads are disposed closer to the extended portion of the power source wiring pattern than the output wiring pattern, and are arranged along the extended portion,
wherein a cavity is disposed on the one principal surface of the base material constituting the sealing member, and a wall portion is provided in a manner as to enclose the cavity,
wherein a bottom face of the cavity is formed in an approximately rectangular shape and is of a curved surface, and
wherein on condition of (m<n), the plurality of connection pads are disposed in a (m×n) matrix shape on the bottom face of the cavity, and an n arrangement direction is a long side direction of the cavity.

2. The oscillator according to claim 1,
wherein a pair of driving electrodes disposed on the piezoelectric resonator is disposed in a non-corresponding state with respect to the alternating current output terminal, the direct current power source terminal, the output wiring pattern, and the power source wiring pattern.

3. The oscillator according to claim 2,
wherein the wiring patterns coupled to the connection pads are disposed along a side face of the integrated circuit element.

4. The oscillator according to claim 1,
wherein a pair of recognition portions for image recognition is disposed on the one principal surface of the base material as an electrode.

5. The oscillator according to claim 1,
wherein a boss portion for the piezoelectric resonator and for image recognition is disposed on the one principal surface of the base material.

6. The oscillator according claim 1,
wherein a vibrating region of the piezoelectric resonator is hermetically enclosed with a plurality of sealing members, and
wherein a gap between the sealing member and the integrated circuit element is equal to or less than 50 μm, and a gap between the sealing member and the piezoelectric resonator is larger than the gap between the sealing member and the integrated circuit element.

7. An oscillator comprising:
a sealing member;
a pair of electrode pads configured to electrically couple a piezoelectric resonator that effects piezoelectrical vibration;
a plurality of connection pads configured to electrically couple an integrated circuit element constituting an oscillation circuit with the piezoelectric resonator; and
wiring patterns configured to establish electrical continuity between the pair of electrode pads and the plurality of connection pads,
wherein the piezoelectric resonator and the integrated circuit element are disposed side by side in plan view,
the wiring patterns further comprising:
an output wiring pattern configured to establish electrical continuity between one of the connection pads and an alternating current output terminal of the oscillation circuit; and
a power source wiring pattern configured to establish electrical continuity between one of the connection pads and a direct current power source terminal of the oscillation circuit,
wherein the electrode pads and the connection pads are disposed on one principal surface of a base material constituting the sealing member, and the wiring patterns are disposed at least on the one principal surface of the base material constituting the sealing member,
wherein the power source wiring pattern has an extended portion which extends along a direction of the piezoelectric resonator and the integrated circuit element,
wherein on the one principal surface, the pair of electrode pads are disposed closer to the extended portion of the power source wiring pattern than the output wiring pattern, and are arranged along the extended portion, and wherein a protrusion portion is provided on the electrode pads.

8. An oscillator comprising:
a sealing member;
a pair of electrode pads configured to electrically couple a piezoelectric resonator that effects piezoelectrical vibration;
a plurality of connection pads configured to electrically couple an integrated circuit element constituting an oscillation circuit with the piezoelectric resonator; and
wiring patterns configured to establish electrical continuity between the pair of electrode pads and the plurality of connection pads,
the wiring patterns further comprising:
an output wiring pattern configured to establish electrical continuity between one of the connection pads and an alternating current output terminal of the oscillation circuit;
a power source wiring pattern configured to establish electrical continuity between one of the connection pads and a direct current power source terminal of the oscillation circuit; and
a ground wiring pattern configured to establish electrical continuity between one of the connection pads and a ground terminal of the oscillation circuit,
wherein the ground wiring pattern has an extended portion which extends along a side face of the integrated circuit element,
wherein the electrode pads and the connection pads are disposed on one principal surface of a base material constituting the sealing member, and the wiring patterns are disposed at least on the one principal surface of the base material constituting the sealing member,
wherein the plurality of connection pads are disposed on the one principal surface of the base material constituting the sealing member, and the ground terminal is disposed on other principal surface of the base material,
wherein the connection pads conducted to the ground terminal are disposed in a corresponding region on the one principal surface of the base material corresponding to the ground terminal disposed on the other principal surface of the base material, and the integrated circuit element is disposed on the connection pads, and
wherein the ground terminal and a part of the integrated circuit element are thereby layered opposite to each other, with the base material being sandwiched therebetween.

9. The oscillator according to claim 8,
wherein a cavity is disposed on the one principal surface of the base material constituting the sealing member, and a wall portion is provided in a manner as to enclose the cavity,
wherein a bottom face of the cavity is formed in an approximately rectangular shape and is of a curved surface, and
wherein on condition of (m<n), the plurality of connection pads are disposed in a (m×n) matrix shape on the bottom face of the cavity, and an n arrangement direction is a long side direction of the cavity.

10. The oscillator according to claim 8,
wherein a protrusion portion is provided on the electrode pads.

11. The oscillator according to claim 8,
wherein a pair of driving electrodes disposed on the piezoelectric resonator is disposed in a non-corresponding state with respect to the alternating current output terminal, the direct current power source terminal, the output wiring pattern, and the power source wiring pattern.

12. The oscillator according to claim 11,
wherein the wiring patterns coupled to the connection pads are disposed along a side face of the integrated circuit element.

13. The oscillator according to claim 8,
wherein a pair of recognition portions for image recognition is disposed on the one principal surface of the base material as an electrode.

14. The oscillator according to claim 8,
wherein a boss portion for the piezoelectric resonator and for image recognition is disposed on the one principal surface of the base material.

15. The oscillator according to claim 8,
wherein a vibrating region of the piezoelectric resonator is hermetically enclosed with a plurality of sealing members, and
wherein a gap between the sealing member and the integrated circuit element is equal to or less than 50 μm, and a gap between the sealing member and the piezoelectric resonator is larger than the gap between the sealing member and the integrated circuit element.

\* \* \* \* \*